United States Patent
Tokunaga et al.

(10) Patent No.: US 12,386,262 B2
(45) Date of Patent: Aug. 12, 2025

(54) RESIST UNDERLAYER FILM-FORMING COMPOSITION USING CARBON-OXYGEN DOUBLE BOND

(71) Applicant: NISSAN CHEMICAL CORPORATION, Tokyo (JP)

(72) Inventors: Hikaru Tokunaga, Toyama (JP); Hiroto Ogata, Toyama (JP); Keisuke Hashimoto, Toyama (JP); Makoto Nakajima, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 995 days.

(21) Appl. No.: 17/055,148

(22) PCT Filed: May 21, 2019

(86) PCT No.: PCT/JP2019/020146
§ 371 (c)(1),
(2) Date: Nov. 13, 2020

(87) PCT Pub. No.: WO2019/225615
PCT Pub. Date: Nov. 28, 2019

(65) Prior Publication Data
US 2021/0116814 A1    Apr. 22, 2021

(30) Foreign Application Priority Data

May 25, 2018   (JP) .................................. 2018-100502

(51) Int. Cl.
| | |
|---|---|
| *G03F 7/11* | (2006.01) |
| *C08G 61/12* | (2006.01) |
| *G03F 7/004* | (2006.01) |
| *G03F 7/09* | (2006.01) |
| *G03F 7/16* | (2006.01) |
| *G03F 7/26* | (2006.01) |
| *G03F 7/30* | (2006.01) |

(52) U.S. Cl.
CPC .............. *G03F 7/11* (2013.01); *C08G 61/124* (2013.01); *G03F 7/0045* (2013.01); *G03F 7/168* (2013.01); *G03F 7/26* (2013.01); *G03F 7/30* (2013.01); *C08G 2261/3241* (2013.01)

(58) Field of Classification Search
CPC ... G03F 7/11; G03F 7/091; G03F 7/30; C08G 61/214; C08G 2261/3241
See application file for complete search history.

(56) References Cited

U.S. PATENT DOCUMENTS

| | | | | |
|---|---|---|---|---|
| 2003/0022109 A1* | 1/2003 | Kobayashi | ............ | G03F 7/0382 430/311 |
| 2003/0162125 A1* | 8/2003 | Deshpande | ............ | C08G 59/42 430/323 |
| 2004/0241577 A1 | 12/2004 | Hatakeyama et al. | | |
| 2014/0363957 A1 | 12/2014 | Hatakeyama et al. | | |
| 2015/0248057 A1* | 9/2015 | Ohnishi | ................. | C08G 14/06 430/319 |
| 2017/0327644 A1* | 11/2017 | Masuda | .................. | G03F 7/075 |
| 2018/0314154 A1 | 11/2018 | Saito et al. | | |
| 2019/0048129 A1 | 2/2019 | Nakasugi et al. | | |
| 2019/0137878 A1 | 5/2019 | Tokunaga et al. | | |
| 2021/0124268 A1* | 4/2021 | Tokunaga | ................ | C08G 8/02 |

FOREIGN PATENT DOCUMENTS

| | | |
|---|---|---|
| JP | 2004-354554 A | 12/2004 |
| JP | 2014-029435 A | 2/2014 |
| JP | 2015-018223 A | 1/2015 |
| WO | 2017/069063 A1 | 4/2017 |
| WO | 2017/137142 A1 | 8/2017 |
| WO | 2017/188263 A1 | 11/2017 |

OTHER PUBLICATIONS

Aug. 13, 2019 International Search Report issued in International Patent Application No. PCT/JP2019/020146.
Jan. 10, 2024 Office Action issued in Chinese Patent Application No. 201980034895.1.

\* cited by examiner

*Primary Examiner* — John S. Chu
(74) *Attorney, Agent, or Firm* — Oliff PLC

(57) ABSTRACT

A resist lower layer film formation composition that exhibits a high etching resistance and a good dry-etching rate ratio and optical constant, exhibits good coating performance even on a so-called stepped substrate, produces a small film thickness difference after embedding, and enables a flat film to be formed. Also a method for manufacturing a polymer suitable for the resist lower layer film formation composition, a resist lower layer film in which the formation composition is used, and a method for manufacturing a semiconductor device. A resist lower layer film formation composition containing: a solvent; and a reaction product between an aromatic compound having 6-60 carbon atoms and a carbon-oxygen double bond of an oxygen-containing compound having 3-60 carbon atoms. The oxygen-containing compound has, in one molecule, one partial structure: —CON< or —COO—. In the reaction product, one carbon atom of the oxygen-containing compound links two of the aromatic compounds.

24 Claims, 1 Drawing Sheet

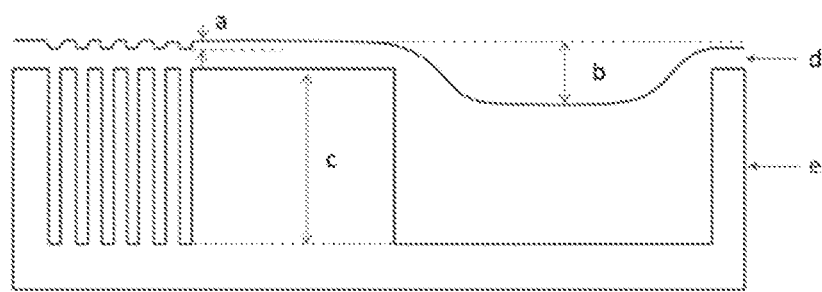

RESIST UNDERLAYER FILM-FORMING COMPOSITION USING CARBON-OXYGEN DOUBLE BOND

TECHNICAL FIELD

The present invention relates to a resist underlayer film-forming composition that has high etching resistance and good optical constants, offers a good dry etching rate ratio, and exhibits high covering performance even on a so-called stepped substrate to be able to form a flat film with a small variation in film thickness when applied to fill the unevenness. The present invention also relates to a method for producing a polymer suitably used in the resist underlayer film-forming composition, to a resist underlayer film formed using the resist underlayer film-forming composition, and to a method for manufacturing a semiconductor device.

BACKGROUND ART

In recent years, resist underlayer film materials for the multilayer resist processes have been required to function as antireflection films particularly in the exposure to short wavelengths, to have appropriate optical constants, and also to exhibit etching resistance during the processing of substrates. The use of a polymer that has a repeating unit containing a benzene ring has been proposed (Patent Literature 1).

CITATION LIST

Patent Literature

Patent Literature 1: JP 2004-354554 A

SUMMARY OF INVENTION

Technical Problem

The miniaturization of resist patterns requires thinner resist layers. A lithographic process is known in which at least two resist underlayer films are formed, and the resist underlayer films are used as mask materials. Specifically, at least one organic film (organic underlayer film) and at least one inorganic underlayer film are formed on a semiconductor substrate, the inorganic underlayer film is patterned through a resist pattern as a mask that is formed in an upper resist film, and the resultant pattern is used as a mask in the patterning of the organic underlayer film. This method is said to be capable of forming high aspect ratio patterns. For example, the materials for forming the at least two layers are a combination of an organic resin (for example, an acrylic resin or a novolac resin) and an inorganic material (such as a silicon resin (for example, organopolysiloxane) or an inorganic silicon compound (for example, SiON or $SiO_2$)). Furthermore, in recent years, the double patterning technique has been widely used in which a pattern is formed through two lithographic steps and two etching steps. The multilayer process described above is used in each of these steps. In this case, an organic film that is formed after the first patterning is required to be able to flatten the unevenness.

However, a workpiece substrate having a resist pattern with different heights or different densities, namely, the so-called stepped substrate encounters a problem in which the substrate is poorly coated with a resist underlayer film-forming composition and the film that is obtained is irregular and has a large variation in film thickness when applied to fill the unevenness.

The present invention has been made based on approaches to solving the problems discussed above. An aspect of the present invention resides in providing a resist underlayer film-forming composition that has high etching resistance and good optical constants, offers a good dry etching rate ratio, and exhibits high covering performance even on a so-called stepped substrate to be able to form a flat film with a small variation in film thickness when applied to fill the unevenness. Other objects of the present invention are to provide a method for producing a polymer suitably used in the resist underlayer film-forming composition, to provide a resist underlayer film formed using the resist underlayer film-forming composition, and to provide a method for manufacturing a semiconductor device.

Solution to Problem

The present invention embraces the following.

[1] A resist underlayer film-forming composition comprising a solvent and a reaction product of a C6-C60 aromatic compound (A) and a carbon-oxygen double bond contained in a C3-C60 oxygen-containing compound (B), the oxygen-containing compound (B) having one partial structure —CON< or —COO— in the molecule, the reaction product being such that a same single carbon atom in the oxygen-containing compound (B) connects two molecules of the aromatic compound (A).

[2] The resist underlayer film-forming composition according to [1], wherein the oxygen-containing compound (B) is represented by the following formula (1):

[Chemical Formula 1]

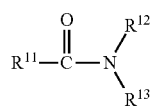

Formula (1)

[wherein
$R^{11}$ and $R^{12}$ are each a C6-C20 aryl group, or a C1-C20 alkyl group which alkyl group is optionally interrupted with an oxygen atom or a sulfur atom, optionally condensed with a C6-C20 aryl group, and optionally substituted with an oxo group or a C6-C20 cycloalkyl group, $R^{11}$ and $R^{12}$ may be bonded to each other to form a ring, and $R^{13}$ is hydrogen, a C6-C20 aryl group, or a C1-C20 alkyl group which alkyl group is optionally interrupted with an oxygen atom or a sulfur atom].

[3] The resist underlayer film-forming composition according to [1], wherein the oxygen-containing compound (B) is represented by the following formula (2):

[Chemical Formula 2]

Formula (2)

[wherein
$R^{21}$ is a C6-C20 aryl group, or a C1-C20 alkyl group which alkyl group is optionally interrupted with an oxygen atom or a sulfur atom, and $R^{22}$ is hydrogen, a C6-C20 aryl group, or a C1-C20 alkyl group which alkyl group is optionally interrupted with an oxygen atom or a sulfur atom].

[4] The resist underlayer film-forming composition according to [1], wherein the compound (A) contains one or more benzene rings, naphthalene rings, anthracene rings or pyrene rings, or a combination thereof.

[5] The resist underlayer film-forming composition according to [1], wherein the compound (A) contains two or more benzene rings, naphthalene rings, anthracene rings or pyrene rings, or a combination thereof.

[6] The resist underlayer film-forming composition according to any one of [1] to [5], further comprising a crosslinking agent.

[7] The resist underlayer film-forming composition according to any one of [1] to [6], further comprising an acid and/or an acid generator.

[8] The resist underlayer film-forming composition according to [1], wherein the solvent has a boiling point of not less than 160° C.

[9] A resist underlayer film, which is a baked product of a coating film comprising the resist underlayer film-forming composition according to any one of [1] to [8].

[10] A method for manufacturing a semiconductor device, comprising the steps of:
  forming a resist underlayer film on a semiconductor substrate using the resist underlayer film-forming composition according to any one of [1] to [8],
  forming a resist film thereon,
  forming a resist pattern by light or electron beam irradiation and development,
  etching the underlayer film through the resist pattern, and
  processing the semiconductor substrate through the underlayer film patterned.

[11] A method for producing a polymer for use in a resist underlayer film-forming composition, comprising the step of reacting a C6-C60 aromatic compound (A) with a carbonyl group contained in a C3-C60 alicyclic compound (B) optionally interrupted with a heteroatom,
  the oxygen-containing compound (B) having one partial structure —CON< or —COO— in the molecule,
  the reaction resulting in a reaction product in which a same single carbon atom in the oxygen-containing compound (B) connects two molecules of the aromatic compound (A).

Advantageous Effects of Invention

The resist underlayer film-forming composition of the present invention has high etching resistance and good optical constants, offers a good dry etching rate ratio, and exhibits high covering performance even on a so-called stepped substrate to be able to form, when applied to fill the unevenness, a flat resist underlayer film that has a small variation in film thickness. Thus, finer processing of substrates is realized.

In particular, the resist underlayer film-forming composition of the present invention is effective in a lithographic process aimed at reducing the thickness of resist films in which at least two resist underlayer films are formed and the resist underlayer films are used as etching masks.

BRIEF DESCRIPTION OF DRAWING

FIG. 1 is a view illustrating an iso-dense bias. The iso-dense bias is (b-a) in FIG. 1.

DESCRIPTION OF EMBODIMENTS

[Resist Underlayer Film-Forming Composition]
A resist underlayer film-forming composition according to the present invention comprises a solvent and a reaction product of a C6-C60 aromatic compound (A) and a carbon-oxygen double bond contained in a C3-C60 oxygen-containing compound (B), and other components. These components will be described sequentially below.

[C6-C60 Aromatic Compound (A)]
The C6-C60 aromatic compound (A) may be:
(a) a monocyclic compound such as benzene, phenol or phloroglucinol,
(b) a condensed ring compound such as naphthalene or dihydroxynaphthalene,
(c) a heterocyclic compound such as furan, thiophene, pyridine or carbazole,
(d) a compound composed of any of the compounds (a) to (c) linked together via a single bond between their aromatic rings, such as biphenyl, phenylindole, 9,9-bis(4-hydroxyphenyl)fluorene or α,α,α',α'-tetrakis(4-hydroxyphenyl)-p-xylene, or
(e) a compound composed of any of the compounds (a) to (d) linked together via a spacer, for example, —CH—, —(CH$_2$)$_n$— (n=1 to 20), —CH=CH—, —CH=CH—, —N=N—, —NH—, —NHR—, —NHCO—, —NRCO—, —S—, —COO—, —O—, —CO— or —CH=N—, between their aromatic rings, such as phenylnaphthylamine.

Examples of the aromatic compounds include benzene, thiophene, furan, pyridine, pyrimidine, pyrazine, pyrrole, oxazole, thiazole, imidazole, naphthalene, anthracene, quinoline, carbazole, quinazoline, purine, indolizine, benzothiophene, benzofuran, indole, phenylindole and acridine.

The aromatic compound (A) may be an aromatic compound containing an amino group, a hydroxyl group, or both. The aromatic compound (A) may be an arylamine compound, a phenol compound, or an aromatic compound including both of these compounds.

An aromatic amine or a phenolic hydroxyl group-containing compound is preferable.

Examples of the aromatic amines include aniline, diphenylamine, phenylnaphthylamine, hydroxydiphenylamine, phenylnaphthylamine, N,N'-diphenylethylenediamine, and N,N'-diphenyl-1,4-phenylenediamine.

Examples of the phenolic hydroxyl group-containing compounds include phenol, dihydroxybenzene, trihydroxybenzene, hydroxynaphthalene, dihydroxynaphthalene, trihydroxynaphthalene, tris(4-hydroxyphenyl)methane, tris(4-hydroxyphenyl)ethane, 1,1,2,2-tetrakis(4-hydroxyphenyl)ethane and polynuclear phenols.

Examples of the polynuclear phenols include dihydroxybenzene, trihydroxybenzene, hydroxynaphthalene, dihydroxynaphthalene, trihydroxynaphthalene, tris(4-hydroxyphenyl)methane, tris(4-hydroxyphenyl)ethane, 2,2'-biphenol, and 1,1,2,2-tetrakis(4-hydroxyphenyl)ethane.

The C6-C60 aromatic compound (A) may be substituted with a C1-C20 alkyl group, a condensed ring group, a heterocyclic group, a hydroxyl group, an amino group, a nitro group, an ether group, an alkoxy group, a cyano group or a carboxyl group in place of a hydrogen atom.

Examples of the C1-C20 alkyl groups include optionally substituted, linear or branched alkyl groups such as, for example, methyl group, ethyl group, n-propyl group, isopropyl group, n-butyl group, sec-butyl group, tert-butyl group, n-pentyl group, isopentyl group, neopentyl group, n-hexyl group, isohexyl group, n-heptyl group, n-octyl group, cyclohexyl group, 2-ethylhexyl group, n-nonyl group, isononyl group, p-tert-butylcyclohexyl group, n-decyl group, n-dodecylnonyl group, undecyl group, dodecyl group, tridecyl group, tetradecyl group, pentadecyl group, hexadecyl group, heptadecyl group, octadecyl group, nonadecyl group and eicosyl group. C1-C12 alkyl groups are preferable, C1-C8 alkyl groups are more preferable, and C1-C4 alkyl groups are still more preferable.

Examples of the C1-C20 alkyl groups interrupted with an oxygen atom, a sulfur atom or an amide bond include those containing a structural unit —$CH_2$—O—, —$CH_2$—S—, —$CH_2$—NHCO— or —$CH_2$—CONH—. The alkyl group may contain one, or two or more units represented by —O—, —S—, —NHCO— or —CONH—. Specific examples of the C1-C20 alkyl groups interrupted with an —O—, —S—, —NHCO— or —CONH— unit include methoxy group, ethoxy group, propoxy group, butoxy group, methylthio group, ethylthio group, propylthio group, butylthio group, methylcarbonylamino group, ethylcarbonylamino group, propylcarbonylamino group, butylcarbonylamino group, methylaminocarbonyl group, ethylaminocarbonyl group, propylaminocarbonyl group and butylaminocarbonyl group, and further include methyl group, ethyl group, propyl group, butyl group, pentyl group, hexyl group, heptyl group, octyl group, nonyl group, decyl group, dodecyl group and octadecyl group each substituted with a substituent such as a methoxy group, an ethoxy group, a propoxy group, a butoxy group, a methylthio group, an ethylthio group, a propylthio group, a butylthio group, a methylcarbonylamino group, an ethylcarbonylamino group, a methylaminocarbonyl group or an ethylaminocarbonyl group. Methoxy group, ethoxy group, methylthio group and ethylthio group are preferable, and methoxy group and ethoxy group are more preferable.

The condensed ring groups are substituents derived from a condensed ring compound. Specific examples thereof include phenyl group, naphthyl group, anthracenyl group, phenanthrenyl group, naphthacenyl group, triphenylenyl group, pyrenyl group and chrysenyl group. Of these, phenyl group, naphthyl group, anthracenyl group and pyrenyl group are preferable.

The heterocyclic groups are substituents derived from a heterocyclic compound. Specific examples thereof include thiophene group, furan group, pyridine group, pyrimidine group, pyrazine group, pyrrole group, oxazole group, thiazole group, imidazole group, quinoline group, carbazole group, quinazoline group, purine group, indolizine group, benzothiophene group, benzofuran group, indole group, acridine group, isoindole group, benzimidazole group, isoquinoline group, quinoxaline group, cinnoline group, pteridine group, chromene group (benzopyran group), isochromene group (benzopyran group), xanthene group, thiazole group, pyrazole group, imidazoline group and azine group. Of these, thiophene group, furan group, pyridine group, pyrimidine group, pyrazine group, pyrrole group, oxazole group, thiazole group, imidazole group, quinoline group, carbazole group, quinazoline group, purine group, indolizine group, benzothiophene group, benzofuran group, indole group and acridine group are preferable, and thiophene group, furan group, pyridine group, pyrimidine group, pyrrole group, oxazole group, thiazole group, imidazole group and carbazole group are most preferable.

Molecules of the aromatic compounds described above may be linked together by a single bond or a spacer.

Examples of the spacers include —CH—, —$(CH_2)_n$— (n=1 to 20), —CH=CH—, —CH—CH—, —N=N—, —NH—, —NHR—, —NHCO—, —NRCO—, —S—, —COO—, —O—, —CO—, —CH=N—, and combinations of two or more thereof. Two or more spacers may be linked together.

The aromatic compound (A) preferably contains one or more benzene rings, naphthalene rings, anthracene rings or pyrene rings, or a combination thereof, and more preferably it contains two or more benzene rings, naphthalene rings, anthracene rings or pyrene rings, or a combination thereof.

The aromatic compounds (A) may be used alone or in combination of two or more. A single or two species of aromatic compounds are preferably used.

[C3-C60 Oxygen-Containing Compound (B)]

The C3-C60 oxygen-containing compound (B) has one partial structure —CON< or —COO— in the molecule, and connects two molecules of the aromatic compound (A) via a same single carbon atom in the oxygen-containing compound (B).

The oxygen-containing compound (B) is preferably represented by the following formula (1):

[Chemical Formula 3]

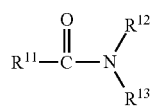

Formula (1)

[wherein
$R^{11}$ and $R^{12}$ are each a C6-C20 aryl group, or a C1-C20 alkyl group which alkyl group is optionally interrupted with an oxygen atom or a sulfur atom, optionally condensed with a C6-C20 aryl group, and optionally substituted with an oxo group or a C6-C20 cycloalkyl group, $R^{11}$ and $R^{12}$ may be bonded to each other to form a ring, and $R^{13}$ is hydrogen, a C6-C20 aryl group, or a C1-C20 alkyl group which alkyl group is optionally interrupted with an oxygen atom or a sulfur atom].

Preferably, the oxygen-containing compound (B) is represented by the following formula (2):

[Chemical Formula 4]

Formula (2)

[wherein
$R^{21}$ is a C6-C20 aryl group, or a C1-C20 alkyl group which alkyl group is optionally interrupted with an oxygen atom or a sulfur atom, and $R^{22}$ is hydrogen, a C6-C20 aryl group, or a C1-C20 alkyl group which alkyl group is optionally interrupted with an oxygen atom or a sulfur atom].

The C6-C20 aryl group may be (a) a group derived from a monocyclic compound such as benzene, (b) a group derived from a condensed ring compound such as naphthalene, (c) a group derived from a heterocyclic compound such as furan, thiophene or pyridine, (d) a group derived from a compound composed of any of the compounds (a) to (c) linked together via a single bond between their aromatic rings, such as biphenyl, or (e) a group derived from a compound composed of any of the compounds (a) to (d) linked together via a spacer, for example, —CH—, —$(CH_2)_n$— (n=1 to 20), —CH=CH—, —CH—CH—, —N=N—, —NH—, —NHR—, —NHCO—, —NRCO—, —S—, —COO—, —O—, —CO— or —CH=N—, between their aromatic rings.

Preferred aromatic rings are benzene rings, naphthalene rings and anthracene rings. The aromatic rings may be linked together via a single bond or a spacer.

Examples of the spacers include —CH—, —(CH$_2$)$_n$— (n=1 to 20), —CH=CH—, —CH≡CH—, —N=N—, —NH—, —NHR—, —NHCO—, —NRCO—, —S—, —COO—, —O—, —CO—, —CH=N—, and combinations of two or more thereof. The two or more spacers may be linked together.

Examples of the C1-C20 alkyl groups include optionally substituted, linear or branched alkyl groups such as, for example, methyl group, ethyl group, n-propyl group, isopropyl group, n-butyl group, sec-butyl group, tert-butyl group, n-pentyl group, isopentyl group, neopentyl group, n-hexyl group, isohexyl group, n-heptyl group, n-octyl group, cyclohexyl group, 2-ethylhexyl group, n-nonyl group, isononyl group, p-tert-butylcyclohexyl group, n-decyl group, n-dodecylnonyl group, undecyl group, dodecyl group, tridecyl group, tetradecyl group, pentadecyl group, hexadecyl group, heptadecyl group, octadecyl group, nonadecyl group and eicosyl group. C1-C12 alkyl groups are preferable, C1-C8 alkyl groups are more preferable, and C1-C4 alkyl groups are still more preferable.

Examples of the C1-C20 alkyl groups interrupted with an oxygen atom or a sulfur atom include those containing a structural unit —CH$_2$—O— or —CH$_2$—S—. The alkyl group may contain one, or two or more units represented by —O— or —S—. Specific examples of the C1-C20 alkyl groups interrupted with an —O— or —S— unit include methoxy group, ethoxy group, propoxy group, butoxy group, methylthio group, ethylthio group, propylthio group and butylthio group, and further include methyl group, ethyl group, propyl group, butyl group, pentyl group, hexyl group, heptyl group, octyl group, nonyl group, decyl group, dodecyl group and octadecyl group each substituted with a substituent such as a methoxy group, an ethoxy group, a propoxy group, a butoxy group, a methylthio group, an ethylthio group, a propylthio group or a butylthio group. Methoxy group, ethoxy group, methylthio group and ethylthio group are preferable, and methoxy group and ethoxy group are more preferable.

Examples of the C6-C20 cycloalkyl groups include cyclohexyl group, cycloheptyl group, cyclooctyl group, cyclononyl group and cyclodecyl group.

Some particularly preferred oxygen-containing compounds (B) are isatin, 4,4-pentamethylene-2-pyrrolidone, N,N-diethyldodecanamide, N,N-diethyl-m-toluamide, lauric acid, methyl laurate, laurylamide, 2-ethylhexanoic acid, [2-(2-methoxyethoxy)ethoxy]acetic acid, butyl 2-methylvalerate, benzoic acid, methyl benzoate and 1-naphthoic acid.

The cyclic carbonyl compounds (B) may be used alone or in combination of two or more. A single or two species of the compounds are preferably used.

[Reaction Products]

By reacting the aromatic compound (A) with the carbon-oxygen double bond, for example, a carbonyl group contained in the oxygen-containing compound (B), a reaction product (a polymer) may be obtained in which a same single carbon atom in the oxygen-containing compound (B) connects two molecules of the aromatic compound (A). In the reaction, the same single carbon atom in the oxygen-containing compound (B) connects two molecules of the aromatic compound (A).

The reaction may use an acid catalyst, for example, a mineral acid such as sulfuric acid, phosphoric acid or perchloric acid, an organic sulfonic acid such as p-toluenesulfonic acid, p-toluenesulfonic acid monohydrate or methanesulfonic acid, or a carboxylic acid such as formic acid or oxalic acid. The amount in which the acid catalyst is used is variable and is selected in accordance with the type of the acid used. The amount ranges usually 0.001 to 10000 parts by mass, preferably 0.01 to 1000 parts by mass, and more preferably 0.1 to 100 parts by mass with respect to 100 parts by mass of the aromatic compound (A).

The condensation reaction and the addition reaction described above may take place in the absence of a solvent, but are usually performed using a solvent. Any solvents that do not inhibit the reaction may be used. Examples thereof include ethers such as 1,2-dimethoxyethane, diethylene glycol dimethyl ether, propylene glycol monomethyl ether, tetrahydrofuran and dioxane.

The reaction temperature ranges usually 40° C. to 200° C. The reaction time is variable and is selected in accordance with the reaction temperature, but ranges usually about 30 minutes to 50 hours.

The weight average molecular weight Mw of the polymer obtained as described above ranges usually 500 to 1,000,000, or 600 to 500,000.

Reaction products suitably used in the present invention will be described in Examples.

[Solvents]

The solvent used in the resist underlayer film-forming composition of the present invention may be any solvent without limitation that can dissolve the reaction product described above. In particular, it is recommended to use a solvent commonly used in the lithographic process in consideration of the application performance of the resist underlayer film-forming composition of the present invention used as a uniform solution.

Examples of the solvents include methyl cellosolve acetate, ethyl cellosolve acetate, propylene glycol, propylene glycol monomethyl ether, propylene glycol monoethyl ether, methyl isobutyl carbinol, propylene glycol monobutyl ether, propylene glycol monomethyl ether acetate, propylene glycol monoethyl ether acetate, propylene glycol monopropyl ether acetate, propylene glycol monobutyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethylene glycol monomethyl ether, ethylene glycol monoethyl ether, ethylene glycol monopropyl ether, ethylene glycol monobutyl ether, ethylene glycol monomethyl ether acetate, ethylene glycol monoethyl ether acetate, ethylene glycol monopropyl ether acetate, ethylene glycol monobutyl ether acetate, diethylene glycol dimethyl ether, diethylene glycol diethyl ether, diethylene glycol dipropyl ether, diethylene glycol dibutyl ether, propylene glycol monomethyl ether, propylene glycol dimethyl ether, propylene glycol diethyl ether, propylene glycol dipropyl ether, propylene glycol dibutyl ether, ethyl lactate, propyl lactate, isopropyl lactate, butyl lactate, isobutyl lactate, methyl formate, ethyl formate, propyl formate, isopropyl formate, butyl formate, isobutyl formate, amyl formate, isoamyl formate, methyl acetate, ethyl acetate, amyl acetate, isoamyl acetate, hexyl acetate, methyl propionate, ethyl propionate, propyl propionate, isopropyl propionate, butyl propionate, isobutyl propionate, methyl butyrate, ethyl butyrate, propyl butyrate, isopropyl butyrate, butyl butyrate, isobutyl butyrate, ethyl hydroxyacetate, ethyl 2-hydroxy-2-methylpropionate, methyl 3-methoxy-2-methylpropionate, methyl 2-hydroxy-3-methylbutyrate, ethyl methoxyacetate, ethyl ethoxyacetate, methyl 3-methoxypropionate, ethyl 3-ethoxypropionate, ethyl 3-methoxypropionate, 3-methoxybutyl acetate, 3-methoxypropyl acetate, 3-methyl-3-methoxybutyl acetate, 3-methyl-3-methoxybutyl propionate, 3-methyl-3-methoxybutyl butyrate, methyl acetoacetate, toluene, xylene, methyl ethyl ketone, methyl propyl ketone, methyl butyl ketone, 2-heptanone, 3-heptanone, 4-heptanone, cyclohexanone, N,N-dimethylformamide, N-methylacetamide, N,N-dimethylacetamide, N-methylpyrrolidone, 4-methyl-2-pentanol and γ-butyrolactone. The solvents may be used alone or in combination of two or more.

Further, use may be made of the following compounds described in Japanese Patent Application No. 2017-140193.

[Chemical Formula 5]

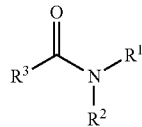

Formula (i)

(In formula (i), $R^1$, $R^2$ and $R^3$ are each a hydrogen atom or a C1-C20 alkyl group optionally interrupted with an oxygen atom, a sulfur atom or an amide bond, and may be the same as or different from one another and may be bonded to one another to form a ring structure.)

Examples of the C1-C20 alkyl groups include optionally substituted, linear or branched alkyl groups such as, for example, methyl group, ethyl group, n-propyl group, isopropyl group, n-butyl group, sec-butyl group, tert-butyl group, n-pentyl group, isopentyl group, neopentyl group, n-hexyl group, isohexyl group, n-heptyl group, n-octyl group, cyclohexyl group, 2-ethylhexyl group, n-nonyl group, isononyl group, p-tert-butylcyclohexyl group, n-decyl group, n-dodecylnonyl group, undecyl group, dodecyl group, tridecyl group, tetradecyl group, pentadecyl group, hexadecyl group, heptadecyl group, octadecyl group, nonadecyl group and eicosyl group. C1-C12 alkyl groups are preferable, C1-C8 alkyl groups are more preferable, and C1-C4 alkyl groups are still more preferable.

Examples of the C1-C20 alkyl groups interrupted with an oxygen atom, a sulfur atom or an amide bond include those containing a structural unit —$CH_2$—O—, —$CH_2$—S—, —$CH_2$—NHCO— or —$CH_2$—CONH—. The alkyl group may contain one, or two or more units represented by —O—, —S—, —NHCO— or —CONH—. Specific examples of the C1-C20 alkyl groups interrupted with an —O—, —S—, —NHCO— or —CONH— unit include methoxy group, ethoxy group, propoxy group, butoxy group, methylthio group, ethylthio group, propylthio group, butylthio group, methylcarbonylamino group, ethylcarbonylamino group, propylcarbonylamino group, butylcarbonylamino group, methylaminocarbonyl group, ethylaminocarbonyl group, propylaminocarbonyl group and butylaminocarbonyl group, and further include methyl group, ethyl group, propyl group, butyl group, pentyl group, hexyl group, heptyl group, octyl group, nonyl group, decyl group, dodecyl group and octadecyl group each substituted with a substituent such as a methoxy group, an ethoxy group, a propoxy group, a butoxy group, a methylthio group, an ethylthio group, a propylthio group, a butylthio group, a methylcarbonylamino group, an ethylcarbonylamino group, a methylaminocarbonyl group or an ethylaminocarbonyl group. Methoxy group, ethoxy group, methylthio group and ethylthio group are preferable, and methoxy group and ethoxy group are more preferable.

The above solvents have a relatively high boiling point and are therefore effective for imparting high filling properties and high flattening properties to the resist underlayer film-forming composition.

Specific examples of preferred compounds represented by formula (i) are shown below.

[Chemical Formula 6]

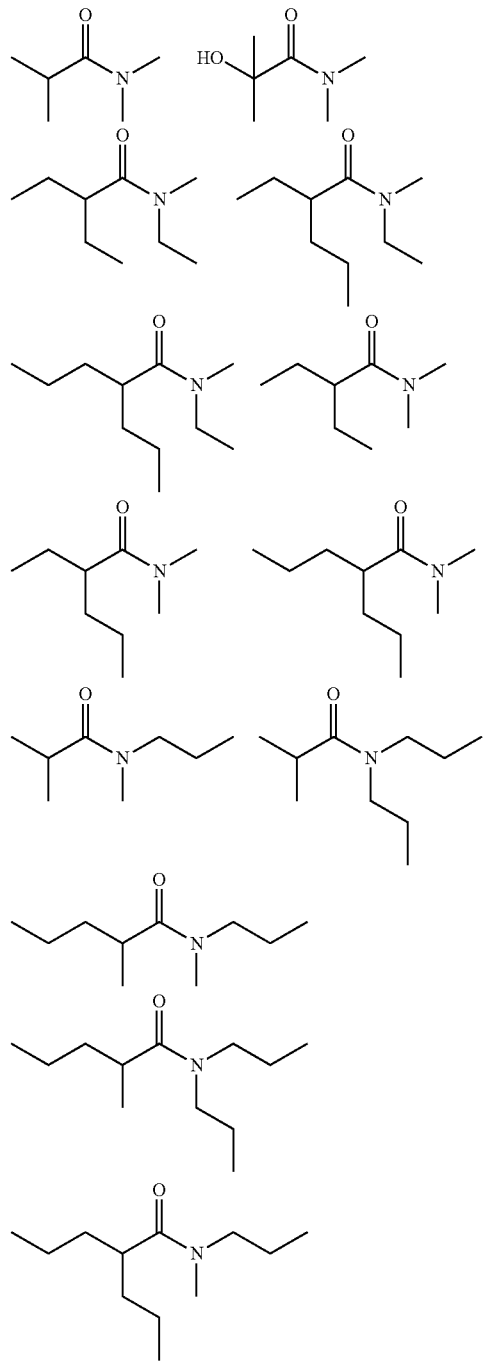

-continued

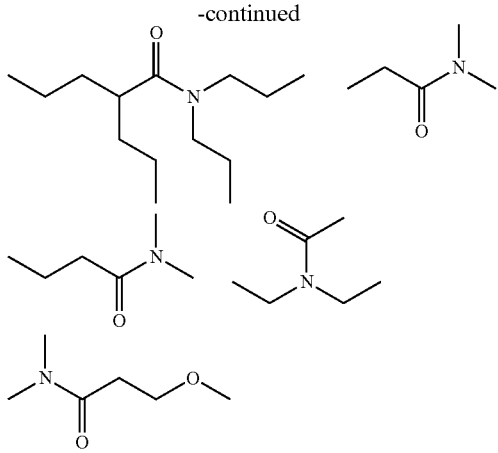

Of the above compounds, preferable are 3-methoxy-N,N-dimethylpropionamide, N,N-dimethylisobutyramide, and the compounds represented b the following formulae:

[Chemical Formula 7]

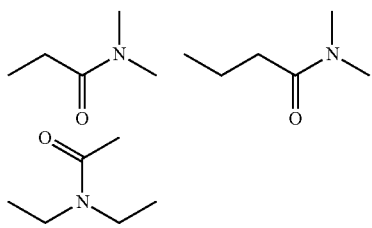

3-Methoxy-N,N-dimethylpropionamide and N,N-dimethylisobutyramide are particularly preferable as the compounds represented by formula (i).

The solvents may be used alone or in combination of two or more. Of the solvents, those having a boiling point of 160° C. or above are preferable, and, among others, propylene glycol monomethyl ether, propylene glycol monomethyl ether acetate, ethyl lactate, butyl lactate, cyclohexanone, 3-methoxy-N,N-dimethylpropionamide, N,N-dimethylisobutyramide, 2,5-dimethylhexane-1,6-diyl diacetate (DAH; CAS: 89182-68-3) and 1,6-diacetoxyhexane (CAS: 6222-17-9) are preferable. Propylene glycol monomethyl ether, propylene glycol monomethyl ether acetate and N,N-dimethylisobutyramide are particularly preferable.

[Crosslinking Agent]

The resist underlayer film-forming composition of the present invention may contain a crosslinking agent. Examples of the crosslinking agent include melamine-based agents, substituted urea-based agents, and polymers thereof. Crosslinking agents having at least two crosslinking substituents are preferable, with examples including methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea and methoxymethylated thiourea. Further, condensates of these compounds may also be used.

The crosslinking agent that is used may be a crosslinking agent having high heat resistance. The crosslinking agent having high heat resistance may be preferably a compound that contains in the molecule a crosslinking substituent having an aromatic ring (for example, a benzene ring or a naphthalene ring).

Examples of such compounds include compounds having a partial structure of the following formula (4), and polymers and oligomers having a repeating unit of the following formula (5):

[Chemical Formula 8]

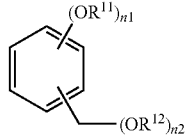

Formula (4)

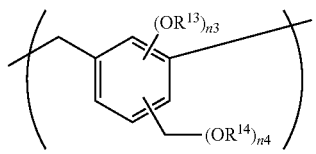

Formula (5)

$R^{11}$, $R^{12}$, $R^{13}$ and $R^{14}$ are each a hydrogen atom or a C1-C10 alkyl group. Examples of the alkyl groups are the same as described hereinabove.

Examples of the compounds, the polymers and the oligomers having formula (4) or formula (5) are illustrated below.

[Chemical Formula 9]

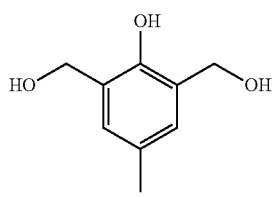

Formula (4-1)

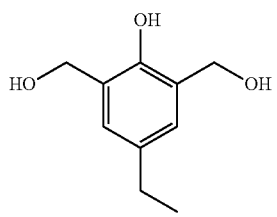

Formula (4-2)

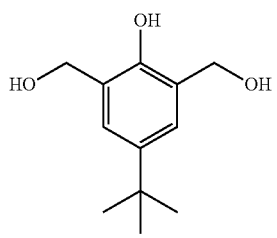

Formula (4-3)

Formula (4-4)
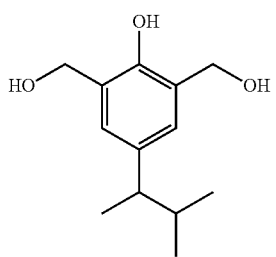
Formula (4-5)
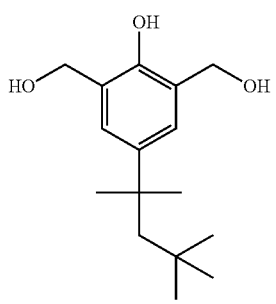
Formula (4-6)
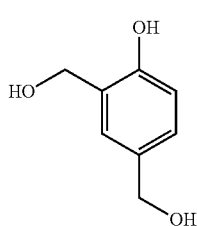
Formula (4-7)
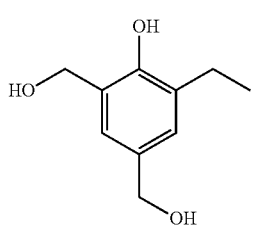
Formula (4-8)
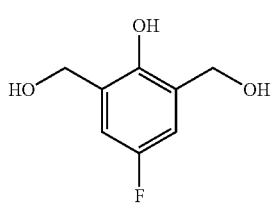
Formula (4-9)
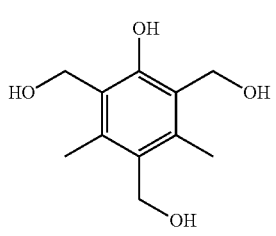
Formula (4-10)
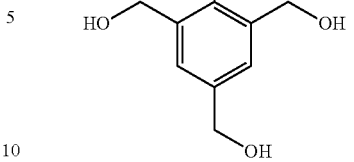
Formula (4-11)
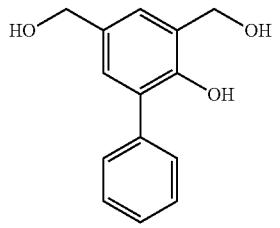
Formula (4-12)
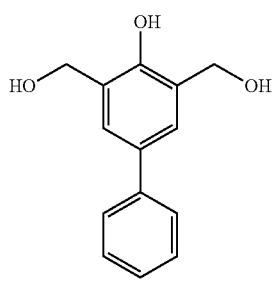
Formula (4-13)
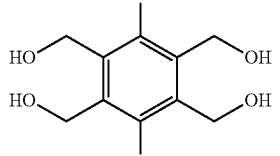
Formula (4-14)
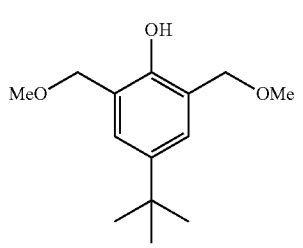
Formula (4-15)
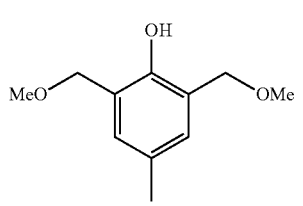
[Chemical Formula 10]
Formula (4-16)
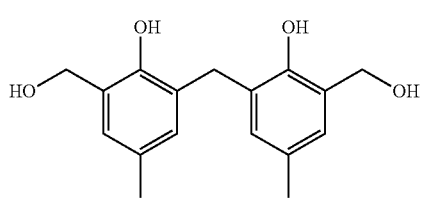

Formula (4-17)
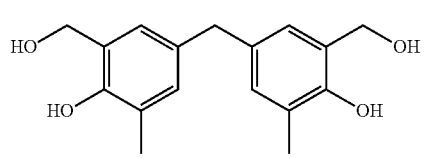

Formula (4-18)
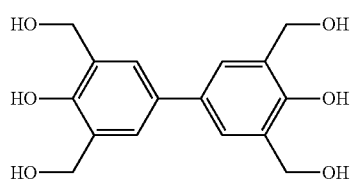

Formula (4-19)
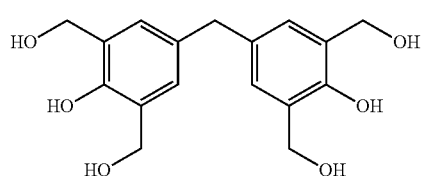

Formula (4-20)
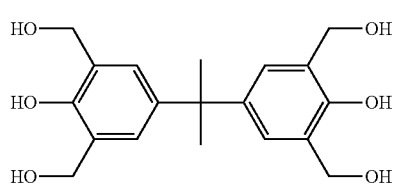

Formula (4-21)
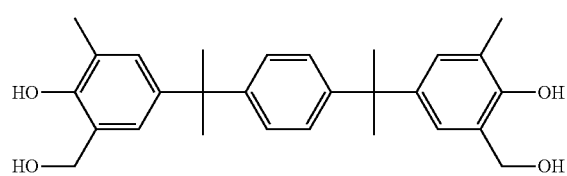

Formula (4-22)
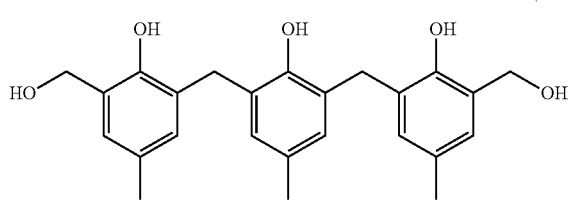

Formula (4-23)
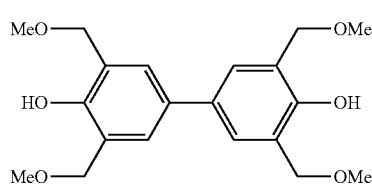

Formula (4-24)
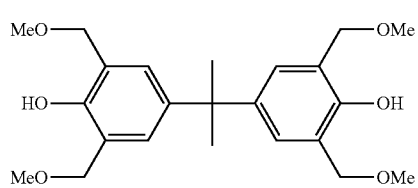

Formula (4-25)
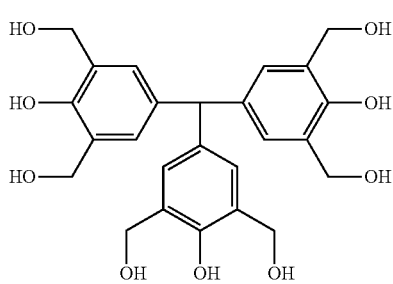

Formula (4-26)
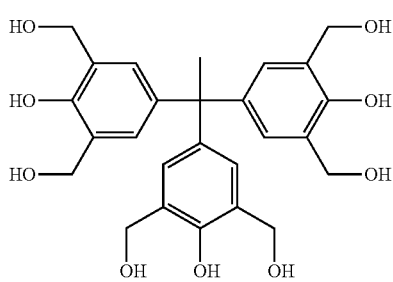

Formula (4-27)
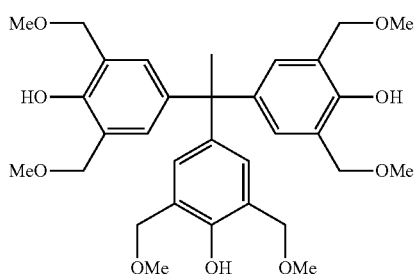

The above compounds are commercially available from ASAHI YUKIZAI CORPORATION or Honshu Chemical Industry Co., Ltd. Among the above crosslinking agents, for example, the compound of formula (4-24) is available under the trade name TM-BIP-A from ASAHI YUKIZAI CORPORATION.

The amount in which the crosslinking agent is added varies depending on factors such as the type of the coating solvent used, the type of the base substrate used, the solution viscosity that is required and the film shape that is required, but may be 0.001 to 80% by mass, preferably 0.01 to 50% by mass, and more preferably 0.05 to 40% by mass relative to the total solid content. The above crosslinking agents may be crosslinked by self-condensation, but, when the reaction product of the present invention has a crosslinking substituent, can undergo a crosslinking reaction with the crosslinking substituent.

[Acids and/or Acid Generator]

The resist underlayer film-forming composition of the present invention may contain an acid and/or an acid generator.

Examples of the acid include p-toluenesulfonic acid, trifluoromethanesulfonic acid, pyridinium p-toluenesulfonic acid, salicylic acid, 5-sulfosalicylic acid, 4-phenolsulfonic acid, camphorsulfonic acid, 4-chlorobenzenesulfonic acid, benzenedisulfonic acid, 1-naphthalenesulfonic acid, citric acid, benzoic acid, hydroxybenzoic acid and naphthalenecarboxylic acid.

The acid may be used alone or in combination of two or more. The amount thereof ranges usually 0.0001 to 20% by mass, preferably 0.0005 to 10% by mass, and more preferably 0.01 to 3% by mass relative to the total solid content.

Examples of the acid generator include thermal acid generators and photo acid generators.

Examples of the thermal acid generators include 2,4,4,6-tetrabromocyclohexadienone, benzoin tosylate, 2-nitrobenzyl tosylate and other organic sulfonic acid alkyl esters.

The photo acid generator generates an acid when the resist is exposed to light, thereby allowing the acidity of the underlayer film to be adjusted. The use of the photo acid generator is an approach to adjusting the acidity of the underlayer film to the acidity of a resist layer that is formed thereon. Further, the shape of a pattern formed in the upper resist layer may be controlled by the adjustment of the acidity of the underlayer film.

Examples of the photo acid generators used in the resist underlayer film-forming composition of the present invention include onium salt compounds, sulfonimide compounds and disulfonyldiazomethane compounds.

Examples of the onium salt compounds include iodonium salt compounds such as diphenyliodonium hexafluorophosphate, diphenyliodonium trifluoromethanesulfonate, diphenyliodonium nonafluoro-n-butanesulfonate, diphenyliodonium perfluoro-n-octanesulfonate, diphenyliodonium camphorsulfonate, bis(4-tert-butylphenyl)iodonium camphorsulfonate and bis(4-tert-butylphenyl)iodonium trifluoromethanesulfonate, and sulfonium salt compounds such as triphenylsulfonium hexafluoroantimonate, triphenylsulfonium nonafluoro-n-butanesulfonate, triphenylsulfonium camphorsulfonate and triphenylsulfonium trifluoromethanesulfonate.

Examples of the sulfonimide compounds include N-(trifluoromethanesulfonyloxy)succinimide, N-(nonafluoro-n-butanesulfonyloxy)succinimide, N-(camphorsulfonyloxy)succinimide and N-(trifluoromethanesulfonyloxy)naphthalimide.

Examples of the disulfonyldiazomethane compounds include bis(trifluoromethylsulfonyl)diazomethane, bis(cyclohexylsulfonyl)diazomethane, bis(phenylsulfonyl)diazomethane, bis(p-toluenesulfonyl)diazomethane, bis(2,4-dimethylbenzenesulfonyl)diazomethane and methylsulfonyl-p-toluenesulfonyldiazomethane.

The acid generator may be used alone or in combination of two or more.

When an acid generator is used, the amount thereof ranges 0.01 to 5 parts by mass, or 0.1 to 3 parts by mass, or 0.5 to 1 part by mass with respect to 100 parts by mass of the solid content in the resist underlayer film-forming composition.

[Additional Components]

A surfactant may be added to the resist underlayer film-forming composition of the present invention in order to prevent the occurrence of defects such as pinholes and striation and to further enhance the application properties with respect to uneven surfaces. Examples of the surfactant include nonionic surfactants, for example, polyoxyethylene alkyl ethers such as polyoxyethylene lauryl ether, polyoxyethylene stearyl ether, polyoxyethylene cetyl ether and polyoxyethylene oleyl ether, polyoxyethylene alkyl allyl ethers such as polyoxyethylene octyl phenol ether and polyoxyethylene nonyl phenol ether, polyoxyethylene/polyoxypropylene block copolymers, sorbitan fatty acid esters such as sorbitan monolaurate, sorbitan monopalmitate, sorbitan monostearate, sorbitan monooleate, sorbitan trioleate and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate; fluorine surfactants such as EFTOP series EF301, EF303 and EF352 (trade names, manufactured by Tochem Products Co., Ltd.), MEGAFACE series F171, F173, R-40, R-40N and R-40LM (trade names, manufactured by DIC CORPORATION), FLUORAD series FC430 and FC431 (trade names, manufactured by Sumitomo 3M Ltd.), and ASAHI GUARD AG710 and SURFLON series S-382, SC101, SC102, SC103, SC104, SC105 and SC106 (trade names, manufactured by AGC Inc.); and organosiloxane polymer KP341 (manufactured by Shin-Etsu Chemical Co., Ltd.). The amount of the surfactant is usually not more than 2.0% by mass, and preferably not more than 1.0% by mass relative to the total solid content in the resist underlayer film material. The surfactant may be used alone or in combination of two or more. When a surfactant is used, the amount thereof ranges 0.0001 to 5 parts by mass, or 0.001 to 1 part by mass, or 0.01 to 0.5 parts by mass with respect to 100 parts by mass of the solid content in the resist underlayer film-forming composition.

Additives such as light absorbers, rheology modifiers and adhesion aids may be added to the resist underlayer film-forming composition of the present invention. Rheology modifiers are effective for enhancing the fluidity of the underlayer film forming composition. Adhesion aids are effective for enhancing the adhesion between the underlayer film and a semiconductor substrate or a resist.

Some example of light absorbers that may be suitably used are commercially available light absorbers described in "Kougyouyou Shikiso no Gijutsu to Shijou (Technology and Market of Industrial Dyes" (CMC Publishing Co., Ltd.) and "Senryou Binran (Dye Handbook)" (edited by The Society of Synthetic Organic Chemistry, Japan), such as, for example, C. I. Disperse Yellow 1, 3, 4, 5, 7, 8, 13, 23, 31, 49, 50, 51, 54, 60, 64, 66, 68, 79, 82, 88, 90, 93, 102, 114 and 124; C. I. Disperse Orange 1, 5, 13, 25, 29, 30, 31, 44, 57, 72 and 73; C. I. Disperse Red 1, 5, 7, 13, 17, 19, 43, 50, 54, 58, 65, 72, 73, 88, 117, 137, 143, 199 and 210; C. I. Disperse Violet 43; C. I. Disperse Blue 96; C. I. Fluorescent Brightening Agent 112, 135 and 163; C. I. Solvent Orange 2 and 45; C. I. Solvent Red 1, 3, 8, 23, 24, 25, 27 and 49; C. I. Pigment Green 10; and C. I. Pigment Brown 2. The light absorber is usually added in a proportion of not more than 10% by mass, and preferably not more than 5% by mass relative to the total solid content in the resist underlayer film-forming composition.

The rheology modifier may be added mainly to enhance the fluidity of the resist underlayer film-forming composition and thereby, particularly in the baking step, to enhance the uniformity in thickness of the resist underlayer film and to increase the filling performance of the resist underlayer film-forming composition with respect to the inside of holes. Specific examples thereof include phthalic acid derivatives such as dimethyl phthalate, diethyl phthalate, diisobutyl phthalate, dihexyl phthalate and butyl isodecyl phthalate; adipic acid derivatives such as di-n-butyl adipate, diisobutyl adipate, diisooctyl adipate and octyl decyl adipate; maleic acid derivatives such as di-n-butyl maleate, diethyl maleate and dinonyl maleate; oleic acid derivatives such as methyl oleate, butyl oleate and tetrahydrofurfuryl oleate; and stearic acid derivatives such as n-butyl stearate and glyceryl stearate. The rheology modifier is usually added in a proportion of less than 30% by mass relative to the total solid content in the resist underlayer film-forming composition.

The adhesion aid may be added mainly to enhance the adhesion between the resist underlayer film-forming composition and a substrate or a resist and thereby to prevent the detachment of the resists particularly during development. Specific examples thereof include chlorosilanes such as trimethylchlorosilane, dimethylmethylolchlorosilane, methyldiphenylchlorosilane and chloromethyldimethylchlorosilane; alkoxysilanes such as trimethylmethoxysilane, dimethyldiethoxysilane, methyldimethoxysilane, dimethylmethylolethoxysilane, diphenyldimethoxysilane and phenyltriethoxysilane; silazanes such as hexamethyldisilazane, N,N'-bis(trimethylsilyl)urea, dimethyltrimethylsilylamine and trimethylsilylimidazole; silanes such as methyloltrichlorosilane, γ-chloropropyltrimethoxysilane, γ-aminopropyltriethoxysilane and γ-glycidoxypropyltrimethoxysilane; heterocyclic compounds such as benzotriazole, benzimidazole, indazole, imidazole, 2-mercaptobenzimidazole, 2-mercaptobenzothiazole, 2-mercaptobenzoxazole, urazole, thiouracyl, mercaptoimidazole and mercaptopyrimidine; and urea or thiourea compounds such as 1,1-dimethylurea and 1,3-dimethylurea. The adhesion aid is usually added in a proportion of less than 5% by mass, and preferably less than 2% by mass relative to the total solid content in the resist underlayer film-forming composition.

The solid content in the resist underlayer film-forming composition of the present invention ranges usually 0.1 to 70% by mass, and preferably 0.1 to 60% by mass. The solid content is the proportion of all the components constituting the resist underlayer film-forming composition except the solvent. The proportion of the reaction product in the solid content ranges 1 to 100% by mass, 1 to 99.9% by mass, 50 to 99.9% by mass, 50 to 95% by mass, or 50 to 90% by mass in the order of decreasing preference.

One of the measures for evaluating whether the resist underlayer film-forming composition is a uniform solution is to pass the composition through a predetermined microfilter. The resist underlayer film-forming composition according to the present invention can be passed through a microfilter having a pore size of 0.1 μm, and shows a uniform solution state.

Examples of the microfilter materials include fluororesins such as PTFE (polytetrafluoroethylene) and PFA (tetrafluoroethylene/perfluoroalkyl vinyl ether copolymer), PE (polyethylene), UPE (ultrahigh molecular weight polyethylene), PP (polypropylene), PSF (polysulfone), PES (polyethersulfone) and nylon, with PTFE (polytetrafluoroethylene) being preferable.

[Resist Underlayer Film and a Method for Manufacturing a Semiconductor Device]

Hereinbelow, a resist underlayer film from the resist underlayer film-forming composition of the present invention, and a method for manufacturing a semiconductor device will be described.

The resist underlayer film-forming composition of the present invention is applied with an appropriate technique such as a spinner or a coater onto a semiconductor device substrate (such as, for example, a silicon wafer substrate, a silicon/silicon dioxide coated substrate, a silicon nitride substrate, a glass substrate, an ITO substrate, a polyimide substrate, or a low dielectric constant material (low-k material) coated substrate), and the coating is baked to form a resist underlayer film. The baking conditions are appropriately selected from a baking temperature of 80° C. to 250° C. and a period of baking time of 0.3 to 60 minutes. The baking temperature ranges preferably 150° C. to 250° C., and the period of baking time ranges preferably 0.5 to 2 minutes. Here, the film thickness of the underlayer film that is formed ranges, for example, 10 to 1000 nm, or 20 to 500 nm, or 30 to 300 nm, or 50 to 200 nm.

Further, an inorganic resist underlayer film (a hard mask) may be formed on the organic resist underlayer film according to the present invention. For example, such a hard mask may be formed by spin coating a silicon-containing resist underlayer film (inorganic resist underlayer film) forming composition described in WO 2009/104552 A1, or by CVD of a Si-based inorganic material.

The resist underlayer film-forming composition according to the present invention may be applied onto a semiconductor substrate having a stepped region and a stepless region (the so-called stepped substrate) and may be baked to form a resist underlayer film having a step height within the range of 3 to 50 nm between the stepped region and the stepless region.

Next, a resist film, for example, a photoresist layer is formed on the resist underlayer film. The photoresist layer may be formed by a well-known method, specifically, by applying a photoresist composition solution onto the underlayer film followed by baking. The film thickness of the photoresist ranges, for example, 50 to 10000 nm, or 100 to 2000 nm, or 200 to 1000 nm.

The photoresist applied onto the resist underlayer film is not particularly limited as long as it is sensitive to light used in the photoexposure. Negative photoresists and positive photoresists may be used. Examples include positive photoresists composed of a novolac resin and a 1,2-naphthoquinonediazide sulfonic acid ester; chemically amplified photoresists composed of a photo acid generator and a binder having a group that is decomposed by an acid to increase the alkali dissolution rate; chemically amplified photoresists composed of an alkali-soluble binder, a photo acid generator, and a low-molecular compound that is decomposed by an acid to increase the alkali dissolution rate of the photoresist; and chemically amplified photoresists composed of a photo acid generator, a binder having a group that is decomposed by an acid to increase the alkali dissolution rate, and a low-molecular compound that is decomposed by an acid to increase the alkali dissolution rate of the photoresist. Specific examples include those available under the trade names of APEX-E from Shipley, PAR 710 from Sumitomo Chemical Co., Ltd., and SEPR 430 from Shin-Etsu Chemical Co., Ltd. Examples further include fluorine-containing polymer-based photoresists described in Proc. SPIE, Vol. 3999, 330-334 (2000), Proc. SPIE, Vol. 3999, 357-364 (2000), and Proc. SPIE, Vol. 3999, 365-374 (2000).

Next, a resist pattern is formed by light or electron beam irradiation and development. First, the resist is photoexposed through a predetermined mask. For example, a near ultraviolet ray, a far ultraviolet ray, or an extreme ultraviolet ray (e.g., EUV (wavelength: 13.5 nm)) may be used for the photoexposure. Specifically, use may be made of, among others, KrF excimer laser beam (wavelength: 248 nm), ArF excimer laser beam (wavelength: 193 nm) or $F_2$ excimer laser beam (wavelength: 157 nm). Of these, ArF excimer laser beam (wavelength: 193 nm) and EUV (wavelength: 13.5 nm) are preferable. After the photoexposure, post-exposure baking may be performed as required. The post-exposure baking is performed under conditions appropriately selected from baking a temperature of 70° C. to 150° C. and a period of baking time of 0.3 to 10 minutes.

In the present invention, the above resist, i.e., the photoresist may be replaced by an electron beam lithographic resist. The electron beam resists may be negative or positive. Examples include chemically amplified resists composed of an acid generator and a binder having a group that is decomposed by an acid to give rise to a change in alkali dissolution rate; chemically amplified resists composed of an alkali-soluble binder, an acid generator, and a low-molecular compound that is decomposed by an acid to change the alkali dissolution rate of the resist; chemically amplified resists composed of an acid generator, a binder having a group that is decomposed by an acid to give rise to a change in alkali dissolution rate, and a low-molecular compound that is decomposed by an acid to change the alkali dissolution rate of the resist; non-chemically amplified resists composed of a binder having a group that is decomposed by an electron beam to give rise to a change in alkali dissolution rate, and non-chemically amplified resists composed of a binder having a moiety that is cleaved by an electron beam to give rise to a change in alkali dissolution rate. The electron beam resist may be patterned using an electron beam as the irradiation source in the same manner as in the case the photoresist is used.

Next, the resist is developed with a developing solution. When, for example, the resist is a positive photoresist, the portions of the photoresist that have been photoexposed are removed to leave a photoresist pattern.

Examples of the developing solutions include alkaline aqueous solutions, for example, aqueous solutions of alkali metal hydroxides such as potassium hydroxide and sodium hydroxide, aqueous solutions of quaternary ammonium hydroxides such as tetramethylammonium hydroxide, tetraethylammonium hydroxide and choline, and aqueous solutions of amines such as ethanolamine, propylamine and ethylenediamine. Further, additives such as surfactants may be added to the developing solutions. The development conditions are appropriately selected from a temperature of 5 to 50° C. and a period of time of 10 to 600 seconds.

After the photoresist (the upper layer) has been patterned as described above, the inorganic underlayer film (the intermediate layer) is removed using the pattern as a protective film, and thereafter the organic underlayer film (the lower layer) is removed using as a protective film the film consisting of the patterned photoresist and the patterned inorganic underlayer film (intermediate layer). Lastly, the semiconductor substrate is processed using the patterned inorganic underlayer film (intermediate layer) and the patterned organic underlayer film (lower layer) as protective films.

First, the portions of the inorganic underlayer film (the intermediate layer) exposed from the photoresist are removed by dry etching to expose the semiconductor substrate. The dry etching of the inorganic underlayer film may be performed using a gas such as tetrafluoromethane ($CF_4$), perfluorocyclobutane ($C_4F_8$), perfluoropropane ($C_3F_8$), trifluoromethane, carbon monoxide, argon, oxygen, nitrogen, sulfur hexafluoride, difluoromethane, nitrogen trifluoride, chlorine trifluoride, chlorine, trichloroborane or dichloroborane. A halogen-containing gas is preferably used in the dry etching of the inorganic underlayer film, and a fluorine-containing gas is more preferably used. Examples of the fluorine-containing gases include tetrafluoromethane ($CF_4$), perfluorocyclobutane ($C_4F_8$), perfluoropropane ($C_3F_8$), trifluoromethane and difluoromethane ($CH_2F_2$).

Thereafter, the organic underlayer film is removed using as a protective film the film consisting of the patterned photoresist and the patterned inorganic underlayer film. The organic underlayer film (the lower layer) is preferably removed by dry etching using an oxygen-containing gas for the reason that the inorganic underlayer film containing a large amount of silicon atoms is hardly removed by dry etching with an oxygen-containing gas.

Lastly, the semiconductor substrate is processed. The semiconductor substrate is preferably processed by dry etching with a fluorine-containing gas.

Examples of the fluorine-containing gases include tetrafluoromethane ($CF_4$), perfluorocyclobutane ($C_4F_8$), perfluoropropane ($C_3F_8$), trifluoromethane and difluoromethane ($CH_2F_2$).

Before the formation of the photoresist, an organic antireflective film may be formed on the upper layer of the resist underlayer films. The antireflective coating composition used herein is not particularly limited and may be appropriately selected from those conventionally used in the lithographic processes. The antireflective film may be formed by a conventional method, for example, by application with a spinner or a coater followed by baking.

In the present invention, an organic underlayer film may be formed on a substrate, thereafter an inorganic underlayer film may be formed thereon, and further a photoresist may be formed thereon. Even in the case where the photoresist is designed with a narrow pattern width and is formed with a small thickness to avoid collapsing of the pattern, the configuration described above allows the substrate to be processed as designed, by selecting an appropriate etching gas. For example, the resist underlayer films may be processed using as the etching gas a fluorine-containing gas capable of etching the photoresist at a sufficiently high rate; the substrate may be processed using as the etching gas a fluorine-containing gas capable of etching the inorganic underlayer film at a sufficiently high rate; and further the substrate may be processed using as the etching gas an oxygen-containing gas capable of etching the organic underlayer film at a sufficiently high rate.

The resist underlayer film formed from the resist underlayer film-forming composition sometimes shows absorption with respect to the light used in the lithographic process, depending on the wavelength of the light. In such cases, the film may function as an antireflective film to effectively prevent the reflection of light from the substrate. Further, the underlayer film formed from the resist underlayer film-forming composition of the present invention may also function as a hard mask. The underlayer film of the present invention may be used as, for example, a layer for preventing the interaction between a substrate and a photoresist, a layer having a function to prevent adverse effects on a substrate by a material used in a photoresist or by a substance generated during the photoexposure of a photoresist, a layer having a function to prevent the diffusion of substances generated from a substrate during heating and baking into an upper photoresist layer, and a barrier layer for reducing the poisoning effects on a photoresist layer by a semiconductor substrate dielectric layer.

Further, the underlayer film formed from the resist underlayer film-forming composition may be used as a filling material that is applied to a substrate with via holes used in the dual damascene process and can fill the holes without clearance. Furthermore, the underlayer film may also be used as a flattening material for flattening the surface of an irregular semiconductor substrate.

EXAMPLES

Hereinbelow, the present invention will be described in more detail with reference to Examples and other experiments. However, it should be construed that the scope of the present invention is in no way limited to such Examples and experiments described below.

The following are the apparatus, etc. used in the measurement of the weight average molecular weight of the polymers obtained in Synthetic Examples below.
Apparatus: HLC-8320 GPC manufactured by TOSOH CORPORATION
GPC columns: Shodex (registered trademark)/Asahipak (registered trademark) (SHOWA DENKO K.K.)
Column temperature: 40° C.
Flow rate: 0.6 mL/min
Eluent: N,N-Dimethylformamide (DMF)
Standard samples: Polystyrenes (TOSOH CORPORATION)

Synthetic Example 1

A 100 mL two-necked flask was loaded with 3.10 g of isatin (manufactured by Tokyo Chemical Industry Co., Ltd.), 10.00 g of TEP-TPA (α,α,α',α'-tetrakis(4-hydroxyphenyl)-p-xylene, manufactured by ASAHI YUKIZAI CORPORATION), 16.14 g of propylene glycol monomethyl ether, 3.04 g of methanesulfonic acid (manufactured by Tokyo Chemical Industry Co., Ltd.), and 3.36 g of 3-mercaptopropionic acid. The mixture was heated to 140° C. and was stirred under reflux for about 3.5 hours. After the completion of the reaction, the solution was dropped into a methanol/water solution to cause reprecipitation. The precipitate obtained was suction filtered, and the filter cake was dried under reduced pressure at 60° C. overnight. The polymer obtained corresponded to formula (2-1). The weight average molecular weight Mw measured by GPC in terms of polystyrene was 8,500.

[Chemical Formula 11]

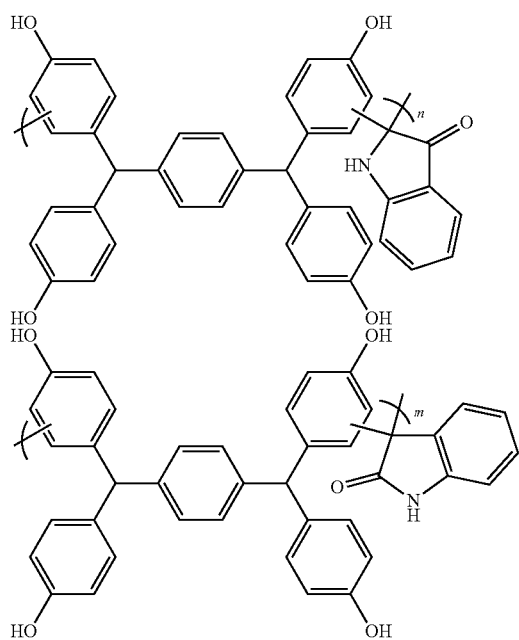

Formula (2-1)

Synthetic Example 2

A 100 mL two-necked flask was loaded with 3.23 g of 4,4-pentamethylene-2-pyrrolidone (manufactured by Tokyo Chemical Industry Co., Ltd.), 10.00 g of TEP-TPA (manufactured by ASAHI YUKIZAI CORPORATION), 16.27 g of propylene glycol monomethyl ether, 3.04 g of methanesulfonic acid (manufactured by Tokyo Chemical Industry Co., Ltd.), and 3.36 g of 3-mercaptopropionic acid. The mixture was heated to 140° C. and was stirred under reflux for about 18 hours. After the completion of the reaction, the solution was dropped into a methanol/water solution to cause reprecipitation. The precipitate obtained was suction filtered, and the filter cake was dried under reduced pressure at 60° C. overnight. The polymer obtained corresponded to formula (2-2). The weight average molecular weight Mw measured by GPC in terms of polystyrene was 47,000.

[Chemical Formula 12]

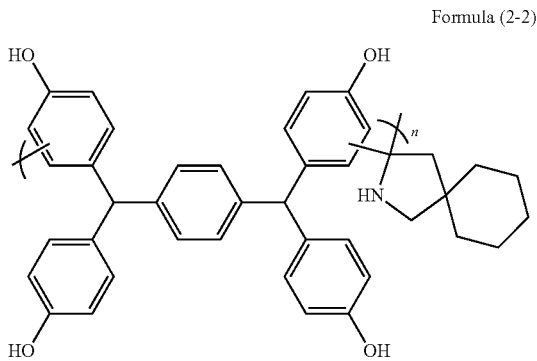

Formula (2-2)

Synthetic Example 3

A 100 mL two-necked flask was loaded with 6.35 g of 4,4-pentamethylene-2-pyrrolidone (manufactured by Tokyo Chemical Industry Co., Ltd.), 8.00 g of 2-phenylindole (manufactured by Tokyo Chemical Industry Co., Ltd.), 20.32 g of propylene glycol monomethyl ether, 5.97 g of methanesulfonic acid (manufactured by Tokyo Chemical Industry Co., Ltd.), and 6.60 g of 3-mercaptopropionic acid. The mixture was heated to 140° C. and was stirred under reflux for about 48 hours. After the completion of the reaction, the solution was dropped into a methanol/water solution to cause reprecipitation. The precipitate obtained was suction filtered, and the filter cake was dried under reduced pressure at 60° C. overnight. The polymer obtained corresponded to formula (2-3). The weight average molecular weight Mw measured by GPC in terms of polystyrene was 2,000.

[Chemical Formula 13]

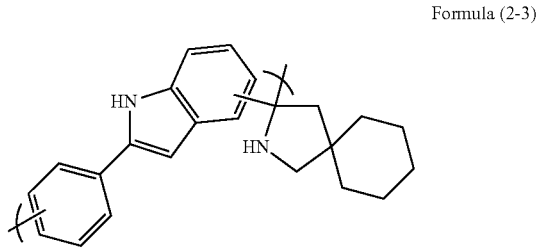

Formula (2-3)

Synthetic Example 4

A 100 mL two-necked flask was loaded with 5.59 g of 4,4-pentamethylene-2-pyrrolidone (manufactured by Tokyo Chemical Industry Co., Ltd.), 8.00 g of N-phenyl-1-naphthylamine (manufactured by Tokyo Chemical Industry Co., Ltd.), 18.86 g of propylene glycol monomethyl ether acetate, 5.26 g of methanesulfonic acid (manufactured by Tokyo Chemical Industry Co., Ltd.), and 5.81 g of 3-mercaptopropionic acid. The mixture was heated to 150° C. and was stirred under reflux for about 48 hours. After the completion of the reaction, the solution was dropped into a methanol/water solution to cause reprecipitation. The precipitate obtained was suction filtered, and the filter cake was dried under reduced pressure at 60° C. overnight. The polymer obtained corresponded to formula (2-4). The weight average molecular weight Mw measured by GPC in terms of polystyrene was 1,900.

[Chemical Formula 14]

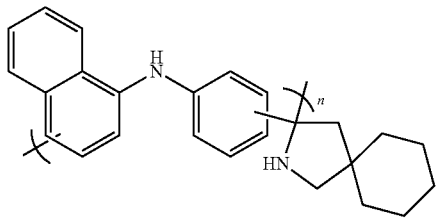

Formula (2-4)

Synthetic Example 5

A 100 mL two-necked flask was loaded with 3.94 g of 4,4-pentamethylene-2-pyrrolidone (manufactured by Tokyo Chemical Industry Co., Ltd.), 9.00 g of 9,9-bis(4-hydroxyphenyl)fluorene (manufactured by Tokyo Chemical Industry Co., Ltd.), 16.64 g of propylene glycol monomethyl ether acetate, 3.71 g of methanesulfonic acid (manufactured by Tokyo Chemical Industry Co., Ltd.), and 4.09 g of 3-mercaptopropionic acid. The mixture was heated to 150° C. and was stirred under reflux for about 22 hours. After the completion of the reaction, the solution was dropped into a methanol/water solution to cause reprecipitation. The precipitate obtained was suction filtered, and the filter cake was dried under reduced pressure at 60° C. overnight. The polymer obtained corresponded to formula (2-5). The weight average molecular weight Mw measured by GPC in terms of polystyrene was 2,600.

[Chemical Formula 15]

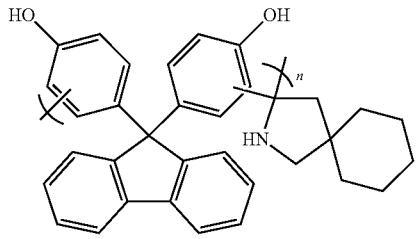

Formula (2-5)

Synthetic Example 6

A 100 mL two-necked flask was loaded with 4.31 g of 4,4-pentamethylene-2-pyrrolidone (manufactured by Tokyo Chemical Industry Co., Ltd.), 4.50 g of 1,5-dihydroxynaphthalene (manufactured by Tokyo Chemical Industry Co., Ltd.), 12.86 g of propylene glycol monomethyl ether acetate, 4.05 g of methanesulfonic acid (manufactured by Tokyo Chemical Industry Co., Ltd.), and 4.31 g of 3-mercaptopropionic acid. The mixture was heated to 150° C. and was stirred under reflux for about 39 hours. After the completion of the reaction, the solution was dropped into a methanol/water solution to cause reprecipitation. The precipitate obtained was suction filtered, and the filter cake was dried under reduced pressure at 60° C. overnight. The polymer obtained corresponded to formula (2-6). The weight average molecular weight Mw measured by GPC in terms of polystyrene was 2,000.

[Chemical Formula 16]

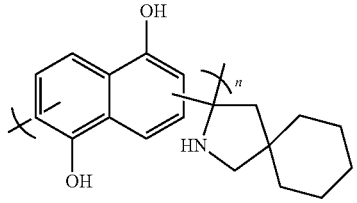

Formula (2-6)

Synthetic Example 7

A 100 mL two-necked flask was loaded with 4.59 g of 4,4-pentamethylene-2-pyrrolidone (manufactured by Tokyo Chemical Industry Co., Ltd.), 5.00 g of carbazole (manufactured by Tokyo Chemical Industry Co., Ltd.), 13.90 g of propylene glycol monomethyl ether acetate, 4.31 g of methanesulfonic acid (manufactured by Tokyo Chemical Industry Co., Ltd.), and 4.76 g of 3-mercaptopropionic acid. The mixture was heated to 150° C. and was stirred under reflux for about 12 hours. After the completion of the reaction, the solution was dropped into a methanol solution to cause reprecipitation. The precipitate obtained was suction filtered, and the filter cake was dried under reduced pressure at 60° C. overnight. The polymer obtained corresponded to formula (2-7). The weight average molecular weight Mw measured by GPC in terms of polystyrene was 15,000.

[Chemical Formula 17]

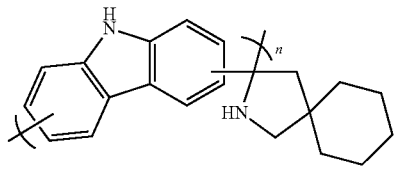

Formula (2-7)

Synthetic Example 8

A 100 mL two-necked flask was loaded with 5.38 g of N,N-diethyldodecanamide (manufactured by Tokyo Chemical Industry Co., Ltd.), 10.00 g of TEP-TPA (manufactured by ASAHI YUKIZAI CORPORATION), 18.42 g of propylene glycol monomethyl ether, 3.04 g of methanesulfonic acid (manufactured by Tokyo Chemical Industry Co., Ltd.), and 3.36 g of 3-mercaptopropionic acid. The mixture was heated to 140° C. and was stirred under reflux for about 40 hours. After the completion of the reaction, the solution was dropped into a methanol/water solution to cause reprecipitation. The precipitate obtained was suction filtered, and the filter cake was dried under reduced pressure at 60° C. overnight. The polymer obtained corresponded to formula (2-8). The weight average molecular weight Mw measured by GPC in terms of polystyrene was 7,500.

[Chemical Formula 18]

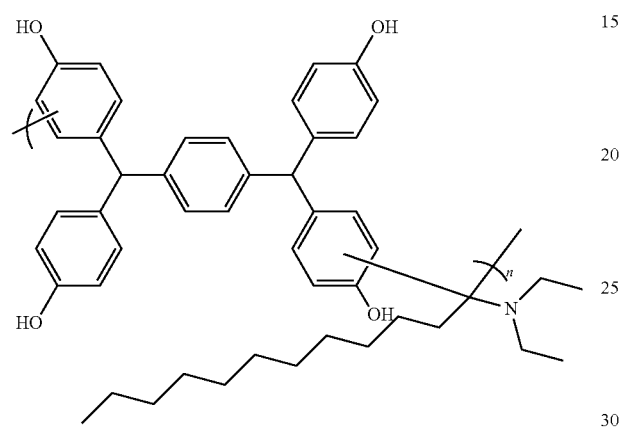

Formula (2-8)

Synthetic Example 9

A 100 mL two-necked flask was loaded with 6.61 g of N,N-diethyldodecanamide (manufactured by Tokyo Chemical Industry Co., Ltd.), 5.00 g of 2-phenylindole (manufactured by Tokyo Chemical Industry Co., Ltd.), 15.34 g of propylene glycol monomethyl ether acetate, 3.37 g of methanesulfonic acid (manufactured by Tokyo Chemical Industry Co., Ltd.), and 4.12 g of 3-mercaptopropionic acid. The mixture was heated to 150° C. and was stirred under reflux for about 48 hours. After the completion of the reaction, the solution was dropped into a methanol/water solution to cause reprecipitation. The precipitate obtained was suction filtered, and the filter cake was dried under reduced pressure at 60° C. overnight. The polymer obtained corresponded to formula (2-9). The weight average molecular weight Mw measured by GPC in terms of polystyrene was 1,400.

[Chemical Formula 19]

Formula (2-9)

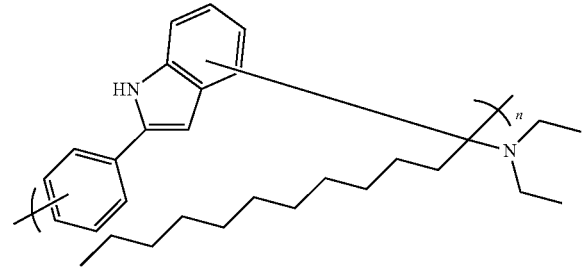

Synthetic Example 10

A 100 mL two-necked flask was loaded with 5.83 g of N,N-diethyldodecanamide (manufactured by Tokyo Chemical Industry Co., Ltd.), 5.00 g of N-phenyl-1-naphthylamine (manufactured by Tokyo Chemical Industry Co., Ltd.), 14.11 g of propylene glycol monomethyl ether acetate, 3.29 g of methanesulfonic acid (manufactured by Tokyo Chemical Industry Co., Ltd.), and 3.63 g of 3-mercaptopropionic acid. The mixture was heated to 150° C. and was stirred under reflux for about 48 hours. After the completion of the reaction, the solution was dropped into a methanol solution to cause reprecipitation. The precipitate obtained was suction filtered, and the filter cake was dried under reduced pressure at 60° C. overnight. The polymer obtained corresponded to formula (2-10). The weight average molecular weight Mw measured by GPC in terms of polystyrene was 900.

[Chemical Formula 20]

Formula (2-10)

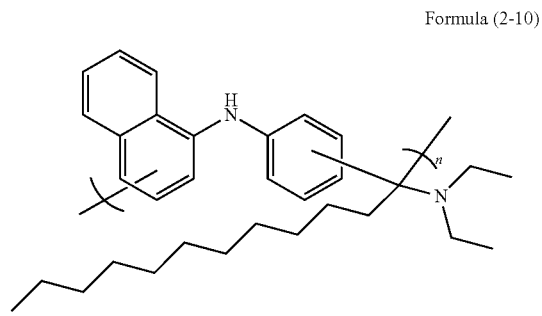

Synthetic Example 11

A 100 mL two-necked flask was loaded with 5.10 g of N,N-diethyldodecanamide (manufactured by Tokyo Chemical Industry Co., Ltd.), 7.00 g of 9,9-bis(4-hydroxyphenyl)fluorene (manufactured by Tokyo Chemical Industry Co., Ltd.), 14.99 g of propylene glycol monomethyl ether acetate, 2.88 g of methanesulfonic acid (manufactured by Tokyo Chemical Industry Co., Ltd.), and 3.18 g of 3-mercaptopropionic acid. The mixture was heated to 150° C. and was stirred under reflux for about 22 hours. After the completion of the reaction, the solution was dropped into a methanol/water solution to cause reprecipitation. The precipitate obtained was suction filtered, and the filter cake was dried under reduced pressure at 60° C. overnight. The polymer obtained corresponded to formula (2-11). The weight average molecular weight Mw measured by GPC in terms of polystyrene was 2,200.

[Chemical Formula 21]

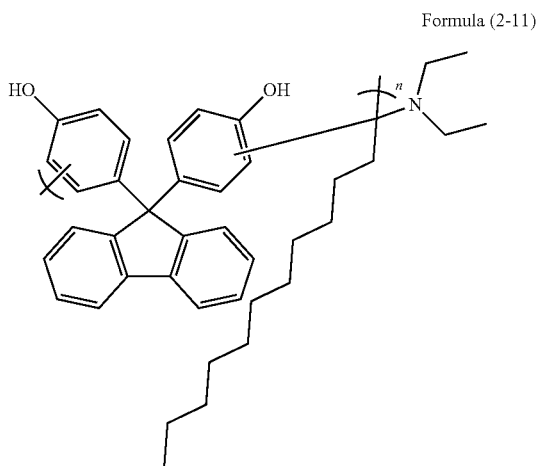

Formula (2-11)

Synthetic Example 12

A 100 mL two-necked flask was loaded with 7.97 g of N,N-diethyldodecanamide (manufactured by Tokyo Chemical Industry Co., Ltd.), 5.00 g of 1,5-dihydroxynaphthalene (manufactured by Tokyo Chemical Industry Co., Ltd.), 17.48 g of propylene glycol monomethyl ether acetate, 4.50 g of methanesulfonic acid (manufactured by Tokyo Chemical Industry Co., Ltd.), and 4.97 g of 3-mercaptopropionic acid. The mixture was heated to 150° C. and was stirred under reflux for about 39 hours. After the completion of the reaction, the solution was dropped into a methanol/water solution to cause reprecipitation. The precipitate obtained was suction filtered, and the filter cake was dried under reduced pressure at 60° C. overnight. The polymer obtained corresponded to formula (2-12). The weight average molecular weight Mw measured by GPC in terms of polystyrene was 2,000.

[Chemical Formula 22]

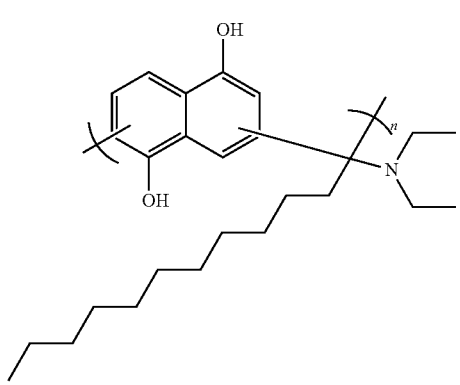

Formula (2-12)

Synthetic Example 13

A 100 mL two-necked flask was loaded with 7.64 g of N,N-diethyldodecanamide (manufactured by Tokyo Chemical Industry Co., Ltd.), 5.00 g of carbazole (manufactured by Tokyo Chemical Industry Co., Ltd.), 16.95 g of propylene glycol monomethyl ether acetate, 4.31 g of methanesulfonic acid (manufactured by Tokyo Chemical Industry Co., Ltd.), and 4.76 g of 3-mercaptopropionic acid. The mixture was heated to 150° C. and was stirred under reflux for about 23 hours. After the completion of the reaction, the solution was dropped into a methanol/water solution to cause reprecipitation. The precipitate obtained was suction filtered, and the filter cake was dried under reduced pressure at 60° C. overnight. The polymer obtained corresponded to formula (2-13). The weight average molecular weight Mw measured by GPC in terms of polystyrene was 4,000.

[Chemical Formula 23]

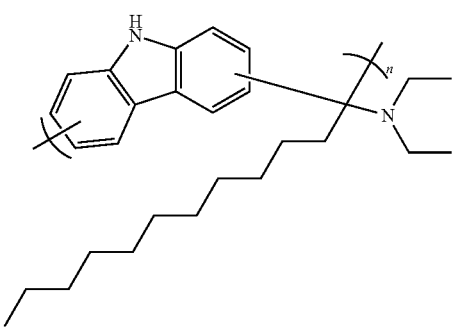

Formula (2-13)

Synthetic Example 14

A 100 mL two-necked flask was loaded with 4.22 g of lauric acid (manufactured by Tokyo Chemical Industry Co., Ltd.), 10.00 g of TEP-TPA (manufactured by ASAHI YUKIZAI CORPORATION), 17.26 g of propylene glycol monomethyl ether, 3.04 g of methanesulfonic acid (manufactured by Tokyo Chemical Industry Co., Ltd.), and 3.36 g of 3-mercaptopropionic acid. The mixture was heated to 140° C. and was stirred under reflux for about 6 hours. After the completion of the reaction, the solution was dropped into a methanol/water solution to cause reprecipitation. The precipitate obtained was suction filtered, and the filter cake was dried under reduced pressure at 60° C. overnight. The polymer obtained corresponded to formula (2-14). The weight average molecular weight Mw measured by GPC in terms of polystyrene was 5,300.

[Chemical Formula 24]

Formula (2-14)

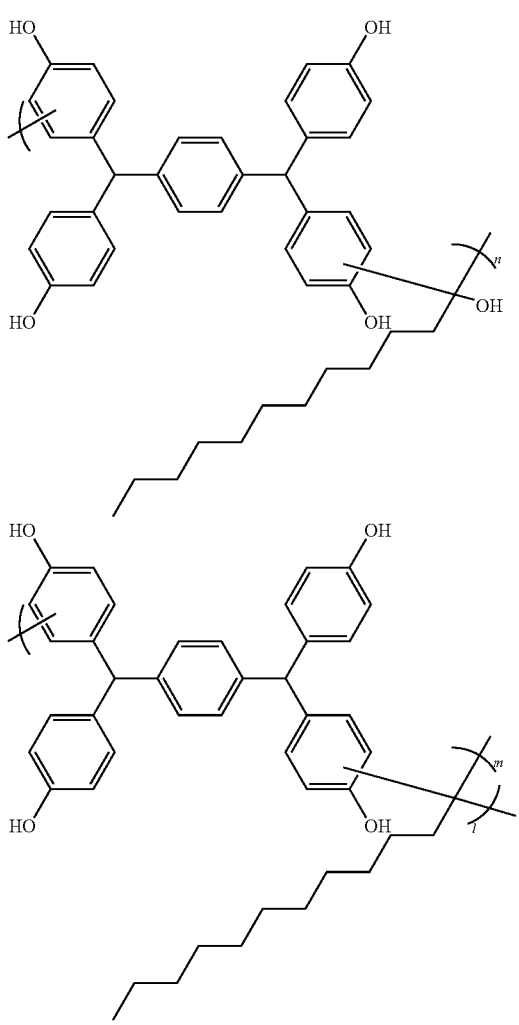

Synthetic Example 15

A 100 mL two-necked flask was loaded with 5.18 g of lauric acid (manufactured by Tokyo Chemical Industry Co., Ltd.), 5.00 g of 2-phenylindole (manufactured by Tokyo Chemical Industry Co., Ltd.), 13.92 g of propylene glycol monomethyl ether acetate, 3.73 g of methanesulfonic acid (manufactured by Tokyo Chemical Industry Co., Ltd.), and 4.12 g of 3-mercaptopropionic acid. The mixture was heated to 150° C. and was stirred under reflux for about 22 hours. After the completion of the reaction, the solution was dropped into a methanol/water solution to cause reprecipitation. The precipitate obtained was suction filtered, and the filter cake was dried under reduced pressure at 60° C. overnight. The polymer obtained corresponded to formula (2-15). The weight average molecular weight Mw measured by GPC in terms of polystyrene was 1,900.

[Chemical Formula 25]

Formula (2-15)

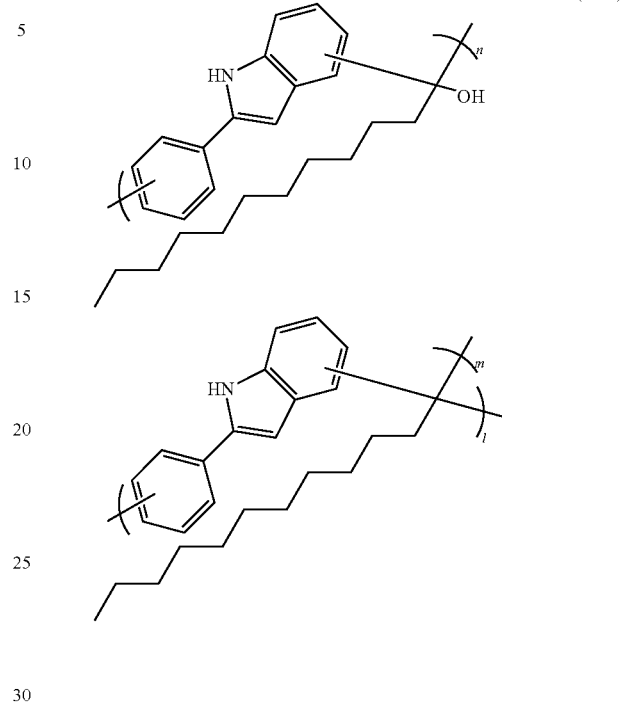

Synthetic Example 16

A 100 mL two-necked flask was loaded with 4.57 g of lauric acid (manufactured by Tokyo Chemical Industry Co., Ltd.), 5.00 g of N-phenyl-1-naphthylamine (manufactured by Tokyo Chemical Industry Co., Ltd.), 12.86 g of propylene glycol monomethyl ether acetate, 3.29 g of methanesulfonic acid (manufactured by Tokyo Chemical Industry Co., Ltd.), and 3.63 g of 3-mercaptopropionic acid. The mixture was heated to 150° C. and was stirred under reflux for about 22 hours. After the completion of the reaction, the solution was dropped into a methanol solution to cause reprecipitation. The precipitate obtained was suction filtered, and the filter cake was dried under reduced pressure at 60° C. overnight. The polymer obtained corresponded to formula (2-16). The weight average molecular weight Mw measured by GPC in terms of polystyrene was 1,200.

[Chemical Formula 26]

Formula (2-16)

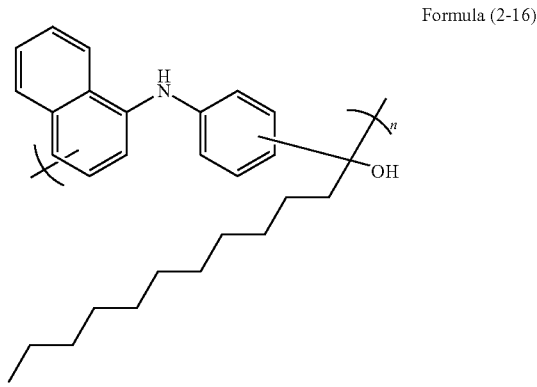

-continued

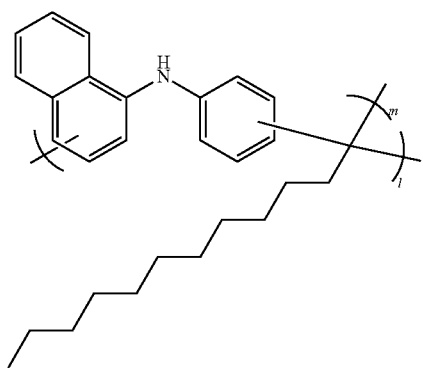

-continued

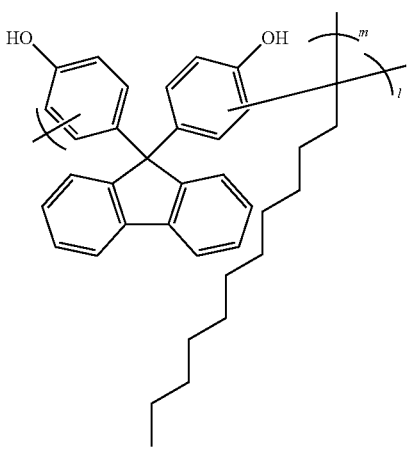

Synthetic Example 17

A 100 mL two-necked flask was loaded with 4.57 g of lauric acid (manufactured by Tokyo Chemical Industry Co., Ltd.), 8.00 g of 9,9-bis(4-hydroxyphenyl)fluorene (manufactured by Tokyo Chemical Industry Co., Ltd.), 15.87 g of propylene glycol monomethyl ether acetate, 3.29 g of methanesulfonic acid (manufactured by Tokyo Chemical Industry Co., Ltd.), and 3.64 g of 3-mercaptopropionic acid. The mixture was heated to 150° C. and was stirred under reflux for about 22 hours. After the completion of the reaction, the solution was dropped into a methanol to cause reprecipitation. The precipitate obtained was suction filtered, and the filter cake was dried under reduced pressure at 60° C. overnight. The polymer obtained corresponded to formula (2-17). The weight average molecular weight Mw measured by GPC in terms of polystyrene was 5,900.

Synthetic Example 18

A 100 mL two-necked flask was loaded with 6.25 g of lauric acid (manufactured by Tokyo Chemical Industry Co., Ltd.), 5.00 g of 1,5-dihydroxynaphthalene (manufactured by Tokyo Chemical Industry Co., Ltd.), 15.76 g of propylene glycol monomethyl ether acetate, 4.50 g of methanesulfonic acid (manufactured by Tokyo Chemical Industry Co., Ltd.), and 4.97 g of 3-mercaptopropionic acid. The mixture was heated to 150° C. and was stirred under reflux for about 23 hours. After the completion of the reaction, the solution was dropped into a methanol/water solution to cause reprecipitation. The precipitate obtained was suction filtered, and the filter cake was dried under reduced pressure at 60° C. overnight. The polymer obtained corresponded to formula (2-18). The weight average molecular weight Mw measured by GPC in terms of polystyrene was 1,800.

[Chemical Formula 27]

Formula (2-17)

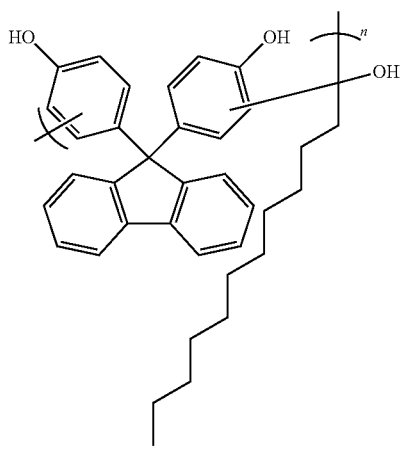

[Chemical Formula 28]

Formula (2-18)

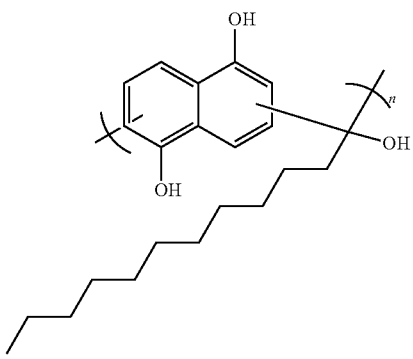

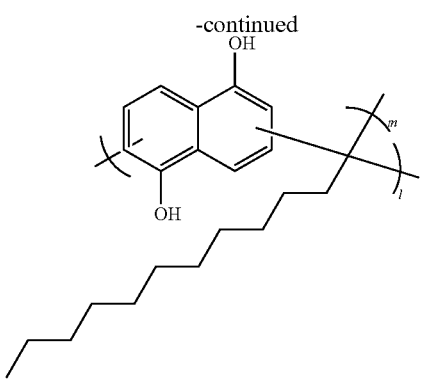

Synthetic Example 19

A 100 mL two-necked flask was loaded with 5.99 g of lauric acid (manufactured by Tokyo Chemical Industry Co., Ltd.), 5.00 g of carbazole (manufactured by Tokyo Chemical Industry Co., Ltd.), 15.30 g of propylene glycol monomethyl ether acetate, 4.31 g of methanesulfonic acid (manufactured by Tokyo Chemical Industry Co., Ltd.), and 4.76 g of 3-mercaptopropionic acid. The mixture was heated to 150° C. and was stirred under reflux for about 23 hours. After the completion of the reaction, the solution was dropped into methanol to cause reprecipitation. The precipitate obtained was suction filtered, and the filter cake was dried under reduced pressure at 60° C. overnight. The polymer obtained corresponded to formula (2-19). The weight average molecular weight Mw measured by GPC in terms of polystyrene was 15,300.

[Chemical Formula 29]

Formula (2-19)

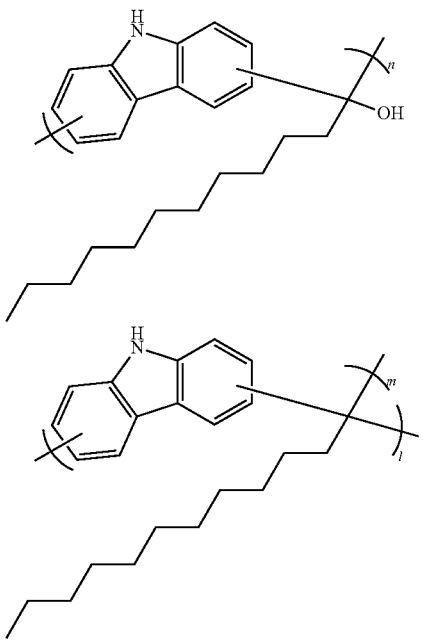

Synthetic Example 20

A 100 mL two-necked flask was loaded with 4.52 g of methyl laurate (manufactured by Tokyo Chemical Industry Co., Ltd.), 10.00 g of TEP-TPA (manufactured by ASAHI YUKIZAI CORPORATION), 17.56 g of propylene glycol monomethyl ether, 3.04 g of methanesulfonic acid (manufactured by Tokyo Chemical Industry Co., Ltd.), and 3.36 g of 3-mercaptopropionic acid. The mixture was heated to 140° C. and was stirred under reflux for about 8 hours. After the completion of the reaction, the solution was dropped into a methanol/water solution to cause reprecipitation. The precipitate obtained was suction filtered, and the filter cake was dried under reduced pressure at 60° C. overnight. The polymer obtained corresponded to formula (2-20). The weight average molecular weight Mw measured by GPC in terms of polystyrene was 23,400.

[Chemical Formula 30]

Formula (2-20)

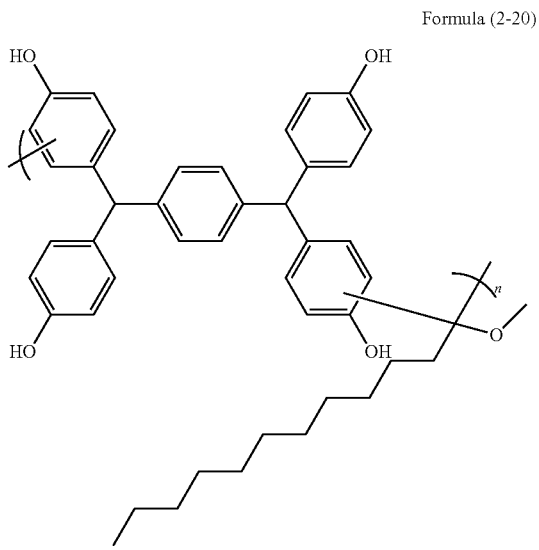

Synthetic Example 21

A 100 mL two-necked flask was loaded with 5.55 g of methyl laurate (manufactured by Tokyo Chemical Industry Co., Ltd.), 5.00 g of 2-phenylindole (manufactured by Tokyo Chemical Industry Co., Ltd.), 14.28 g of propylene glycol monomethyl ether acetate, 3.73 g of methanesulfonic acid (manufactured by Tokyo Chemical Industry Co., Ltd.), and 4.12 g of 3-mercaptopropionic acid. The mixture was heated to 150° C. and was stirred under reflux for about 46 hours. After the completion of the reaction, the solution was dropped into a methanol/water solution to cause reprecipitation. The precipitate obtained was suction filtered, and the filter cake was dried under reduced pressure at 60° C. overnight. The polymer obtained corresponded to formula (2-21). The weight average molecular weight Mw measured by GPC in terms of polystyrene was 1,700.

[Chemical Formula 31]

Formula (2-21)

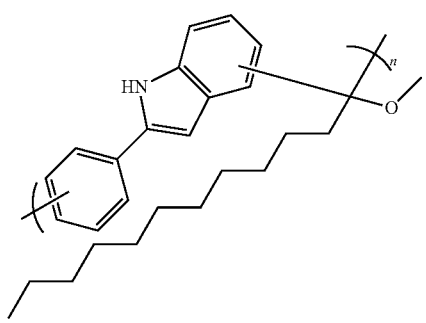

Synthetic Example 22

A 100 mL two-necked flask was loaded with 4.89 g of methyl laurate (manufactured by Tokyo Chemical Industry Co., Ltd.), 5.00 g of N-phenyl-1-naphthylamine (manufactured by Tokyo Chemical Industry Co., Ltd.), 13.18 g of propylene glycol monomethyl ether acetate, 3.29 g of methanesulfonic acid (manufactured by Tokyo Chemical Industry Co., Ltd.), and 3.63 g of 3-mercaptopropionic acid. The mixture was heated to 150° C. and was stirred under reflux for about 46 hours. After the completion of the reaction, the solution was dropped into methanol solution to cause reprecipitation. The precipitate obtained was suction filtered, and the filter cake was dried under reduced pressure at 60° C. overnight. The polymer obtained corresponded to formula (2-22). The weight average molecular weight Mw measured by GPC in terms of polystyrene was 1,000.

[Chemical Formula 32]

Formula (2-22)

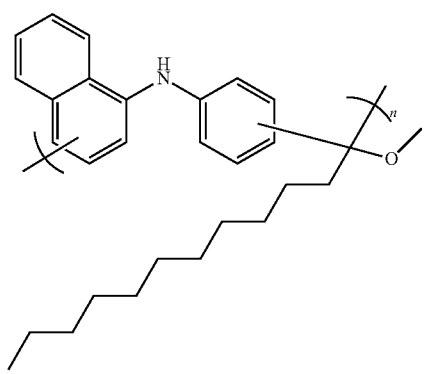

Synthetic Example 23

A 100 mL two-necked flask was loaded with 4.28 g of methyl laurate (manufactured by Tokyo Chemical Industry Co., Ltd.), 7.00 g of 9,9-bis(4-hydroxyphenyl)fluorene (manufactured by Tokyo Chemical Industry Co., Ltd.), 14.16 g of propylene glycol monomethyl ether acetate, 2.88 g of methanesulfonic acid (manufactured by Tokyo Chemical Industry Co., Ltd.), and 3.18 g of 3-mercaptopropionic acid. The mixture was heated to 150° C. and was stirred under reflux for about 46 hours. After the completion of the reaction, the solution was dropped into methanol to cause reprecipitation. The precipitate obtained was suction filtered, and the filter cake was dried under reduced pressure at 60° C. overnight. The polymer obtained corresponded to formula (2-23). The weight average molecular weight Mw measured by GPC in terms of polystyrene was 5,000.

[Chemical Formula 33]

Formula (2-23)

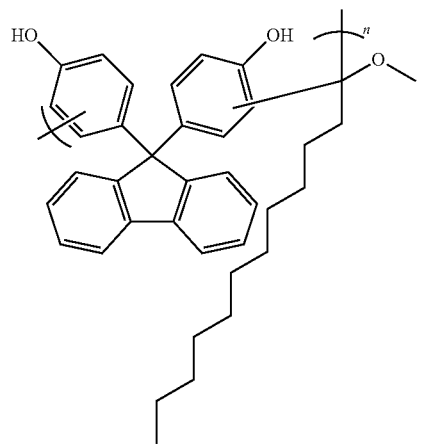

Synthetic Example 24

A 100 mL two-necked flask was loaded with 6.69 g of methyl laurate (manufactured by Tokyo Chemical Industry Co., Ltd.), 5.00 g of 1,5-dihydroxynaphthalene (manufactured by Tokyo Chemical Industry Co., Ltd.), 16.19 g of propylene glycol monomethyl ether acetate, 4.50 g of methanesulfonic acid (manufactured by Tokyo Chemical Industry Co., Ltd.), and 4.97 g of 3-mercaptopropionic acid. The mixture was heated to 150° C. and was stirred under reflux for about 46 hours. After the completion of the reaction, the solution was dropped into a methanol/water solution to cause reprecipitation. The precipitate obtained was suction filtered, and the filter cake was dried under reduced pressure at 60° C. overnight. The polymer obtained corresponded to formula (2-24). The weight average molecular weight Mw measured by PC in terms of polystyrene was 2,700.

[Chemical Formula 34]

Formula (2-24)

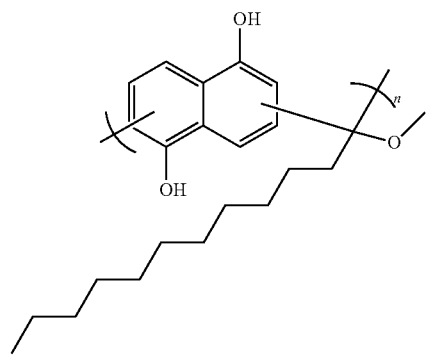

Synthetic Example 25

A 100 mL two-necked flask was loaded with 6.41 g of methyl laurate (manufactured by Tokyo Chemical Industry Co., Ltd.), 5.00 g of carbazole (manufactured by Tokyo Chemical Industry Co., Ltd.), 15.72 g of propylene glycol monomethyl ether acetate, 4.31 g of methanesulfonic acid (manufactured by Tokyo Chemical Industry Co., Ltd.), and 4.76 g of 3-mercaptopropionic acid. The mixture was heated to 150° C. and was stirred under reflux for about 18 hours. After the completion of the reaction, the solution was dropped into methanol to cause reprecipitation. The precipitate obtained was suction filtered, and the filter cake was dried under reduced pressure at 60° C. overnight. The polymer obtained corresponded to formula (2-25). The weight average molecular weight Mw measured by GPC in terms of polystyrene was 9,900.

[Chemical Formula 35]

Formula (2-25)

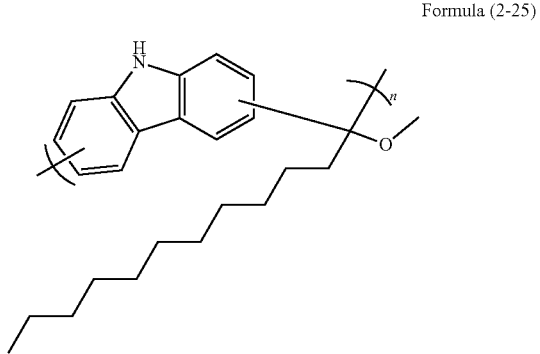

Synthetic Example 26

A 100 mL two-necked flask was loaded with 4.31 g of 2-ethylhexanoic acid (manufactured by Tokyo Chemical Industry Co., Ltd.), 5.00 g of carbazole (manufactured by Tokyo Chemical Industry Co., Ltd.), 13.63 g of propylene glycol monomethyl ether acetate, 4.31 g of methanesulfonic acid (manufactured by Tokyo Chemical Industry Co., Ltd.), and 4.76 g of 3-mercaptopropionic acid. The mixture was heated to 150° C. and was stirred under reflux for about 3.5 hours. After the completion of the reaction, the solution was dropped into methanol to cause reprecipitation. The precipitate obtained was suction filtered, and the filter cake was dried under reduced pressure at 60° C. overnight. The polymer obtained corresponded to formula (2-26). The weight average molecular weight Mw measured by GPC in terms of polystyrene was 4,700.

[Chemical Formula 36]

Formula (2-26)

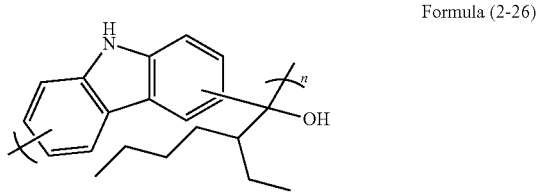

-continued

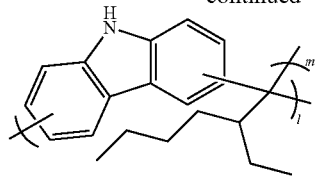

Synthetic Example 27

A 100 mL two-necked flask was loaded with 5.33 g of [2-(2-methoxyethoxy)ethoxy]acetic acid (manufactured by Tokyo Chemical Industry Co., Ltd.), 5.00 g of carbazole (manufactured by Tokyo Chemical Industry Co., Ltd.), 14.64 g of propylene glycol monomethyl ether acetate, 4.31 g of methanesulfonic acid (manufactured by Tokyo Chemical Industry Co., Ltd.), and 4.76 g of 3-mercaptopropionic acid. The mixture was heated to 150° C. and was stirred under reflux for about 3.5 hours. After the completion of the reaction, the solution was dropped into methanol to cause reprecipitation. The precipitate obtained was suction filtered, and the filter cake was dried under reduced pressure at 60° C. overnight. The polymer obtained corresponded to formula (2-27). The weight average molecular weight Mw measured by GPC in terms of polystyrene was 12,300.

[Chemical Formula 37]

Formula (2-27)

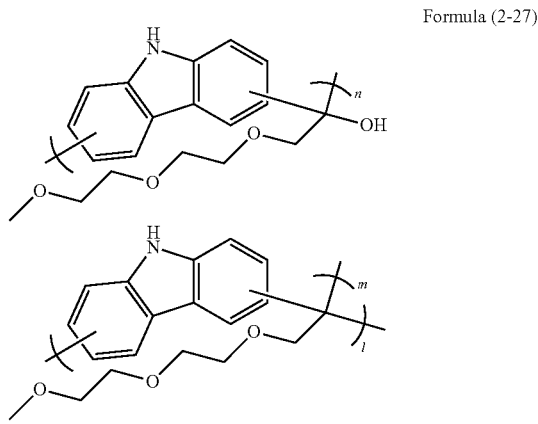

Synthetic Example 28

A 100 mL two-necked flask was loaded with 5.15 g of butyl 2-methylvalerate (manufactured by Tokyo Chemical Industry Co., Ltd.), 5.00 g of carbazole (manufactured by Tokyo Chemical Industry Co., Ltd.), 14.47 g of propylene glycol monomethyl ether acetate, 4.31 g of methanesulfonic acid (manufactured by Tokyo Chemical Industry Co., Ltd.), and 4.76 g of 3-mercaptopropionic acid. The mixture was heated to 150° C. and was stirred under reflux for about 3.5 hours. After the completion of the reaction, the solution was dropped into methanol to cause reprecipitation. The precipitate obtained was suction filtered, and the filter cake was dried under reduced pressure at 60° C. overnight. The polymer obtained corresponded to formula (2-28). The weight average molecular weight Mw measured by GPC in terms of polystyrene was 5,100.

[Chemical Formula 38]

Formula (2-28)

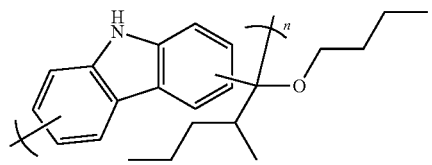

Synthetic Example 29

A 100 mL two-necked flask was loaded with 5.84 g of benzoic acid (manufactured by Tokyo Chemical Industry Co., Ltd.), 8.00 g of carbazole (manufactured by Tokyo Chemical Industry Co., Ltd.), 20.75 g of propylene glycol monomethyl ether acetate, 6.90 g of methanesulfonic acid (manufactured by Tokyo Chemical Industry Co., Ltd.), and 7.62 g of 3-mercaptopropionic acid. The mixture was heated to 150° C. and was stirred under reflux for about 3.5 hours. After the completion of the reaction, the solution was dropped into methanol to cause reprecipitation. The precipitate obtained was suction filtered, and the filter cake was dried under reduced pressure at 60° C. overnight. The polymer obtained corresponded to formula (2-29). The weight average molecular weight Mw measured by GPC in terms of polystyrene was 4,200.

[Chemical Formula 39]

Formula (2-29)

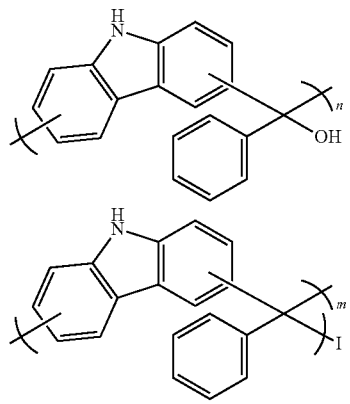

Synthetic Example 30

A 100 mL two-necked flask was loaded with 7.21 g of 1-naphthoic acid (manufactured by Tokyo Chemical Industry Co., Ltd.), 7.00 g of carbazole (manufactured by Tokyo Chemical Industry Co., Ltd.), 20.25 g of propylene glycol monomethyl ether acetate, 6.04 g of methanesulfonic acid (manufactured by Tokyo Chemical Industry Co., Ltd.), and 6.67 g of 3-mercaptopropionic acid. The mixture was heated to 150° C. and was stirred under reflux for about 10 hours. After the completion of the reaction, the solution was dropped into methanol to cause reprecipitation. The precipitate obtained was suction filtered, and the filter cake was dried under reduced pressure at 60° C. overnight. The polymer obtained corresponded to formula (2-30). The weight average molecular weight Mw measured by GPC in terms of polystyrene was 6,500.

[Chemical Formula 40]

Formula (2-30)

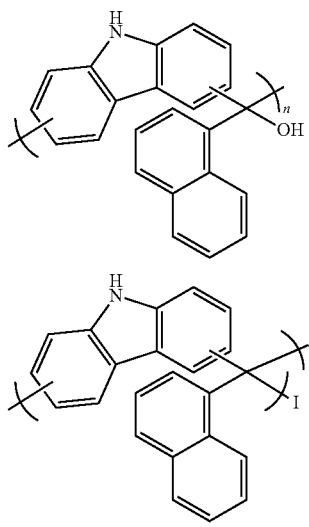

Synthetic Example 31

A 100 mL two-necked flask was loaded with 7.00 g of lauric acid (manufactured by Tokyo Chemical Industry Co., Ltd.), 2.92 g of carbazole (manufactured by Tokyo Chemical Industry Co., Ltd.), 6.12 g of 9,9-bis(4-hydroxyphenyl)fluorene (manufactured by Tokyo Chemical Industry Co., Ltd.), 19.28 g of propylene glycol monomethyl ether acetate, 1.01 g of methanesulfonic acid (manufactured by Tokyo Chemical Industry Co., Ltd.), and 2.23 g of 3-mercaptopropionic acid. The mixture was heated to 150° C. and was stirred under reflux for about 16 hours. After the completion of the reaction, the solution was dropped into methanol to cause reprecipitation. The precipitate obtained was suction filtered, and the filter cake was dried under reduced pressure at 60° C. overnight. The polymer obtained corresponded to formula (2-31). The weight average molecular weight Mw measured by GPC in terms of polystyrene was 4,500.

[Chemical Formula 41]

Formula (2-31)

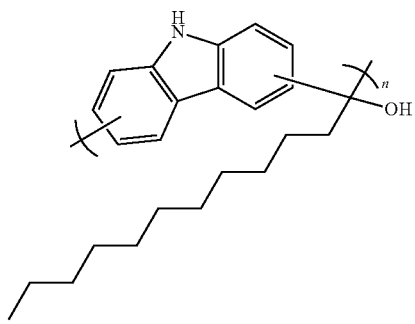

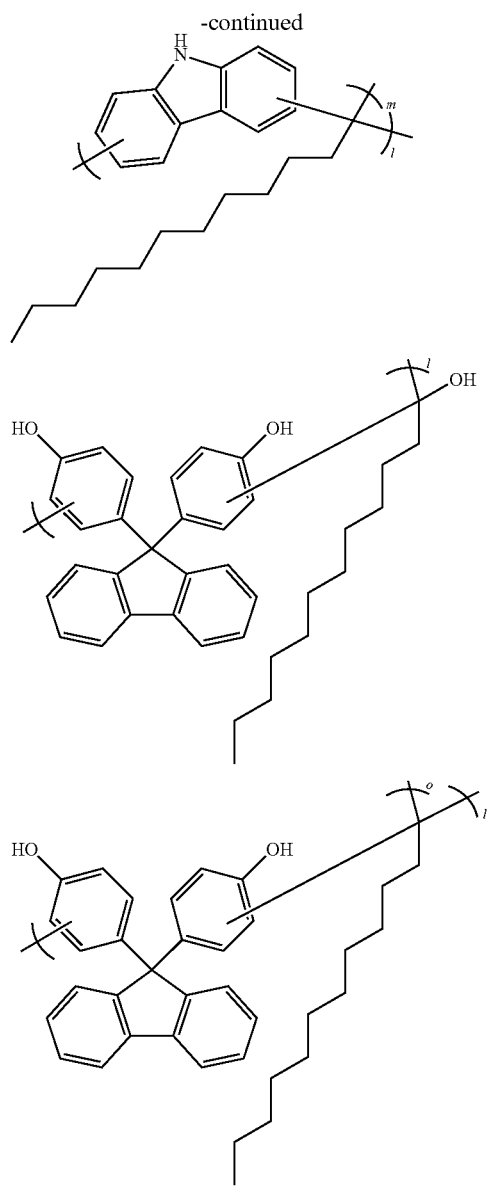

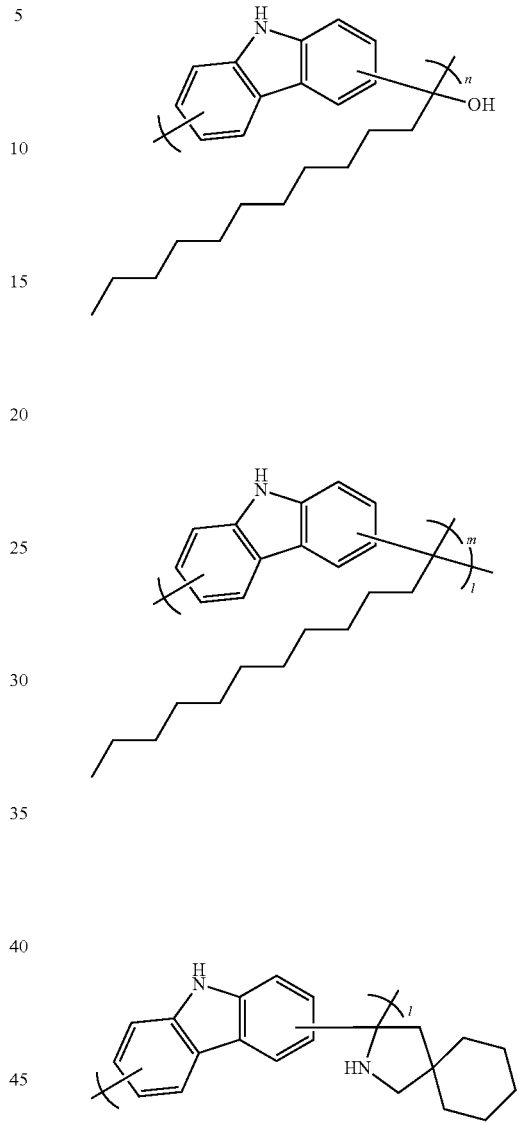

Formula (2-32)

Synthetic Example 32

A 100 mL two-necked flask was loaded with 5.99 g of lauric acid (manufactured by Tokyo Chemical Industry Co., Ltd.), 10.00 g of carbazole (manufactured by Tokyo Chemical Industry Co., Ltd.), 4.58 g of 4,4-pentamethylene-2-pyrrolidone (manufactured by Tokyo Chemical Industry Co., Ltd.), 39.03 g of propylene glycol monomethyl ether acetate, 5.75 g of methanesulfonic acid (manufactured by Tokyo Chemical Industry Co., Ltd.), and 12.70 g of 3-mercaptopropionic acid. The mixture was heated to 150° C. and was stirred under reflux for about 26 hours. After the completion of the reaction, the solution was dropped into methanol to cause reprecipitation. The precipitate obtained was suction filtered, and the filter cake was dried under reduced pressure at 60° C. overnight. The polymer obtained corresponded to formula (2-32). The weight average molecular weight Mw measured by GPC in terms of polystyrene was 5,900.

Synthetic Example 33

A 100 mL two-necked flask was loaded with 5.99 g of lauric acid (manufactured by Tokyo Chemical Industry Co., Ltd.), 10.00 g of carbazole (manufactured by Tokyo Chemical Industry Co., Ltd.), 4.67 g of 1-naphthaldehyde (manufactured by Tokyo Chemical Industry Co., Ltd.), 26.19 g of propylene glycol monomethyl ether acetate, 1.72 g of methanesulfonic acid (manufactured by Tokyo Chemical Industry Co., Ltd.), and 3.81 g of 3-mercaptopropionic acid. The mixture was heated to 150° C. and was stirred under reflux for about 2.5 hours. After the completion of the reaction, the solution was dropped into methanol to cause reprecipitation. The precipitate obtained was suction filtered, and the filter cake was dried under reduced pressure at 60° C. overnight. The polymer obtained corresponded to formula (2-33). The weight average molecular weight Mw measured by GPC in terms of polystyrene was 1,900.

[Chemical Formula 43]

Formula (2-33)

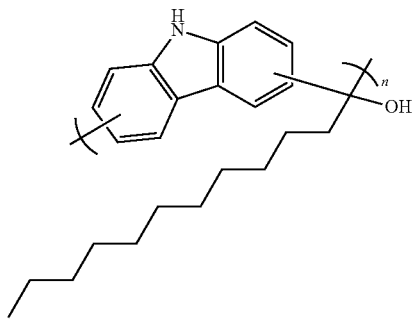

[Chemical Formula 44]

Formula (2-34)

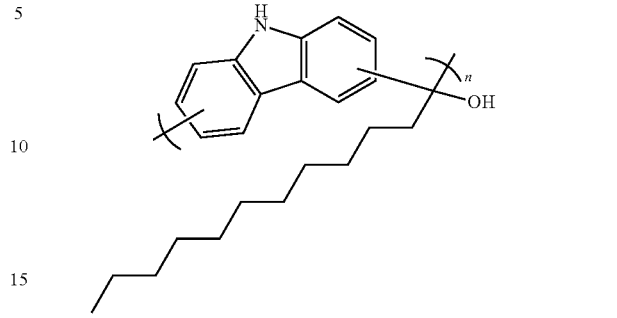

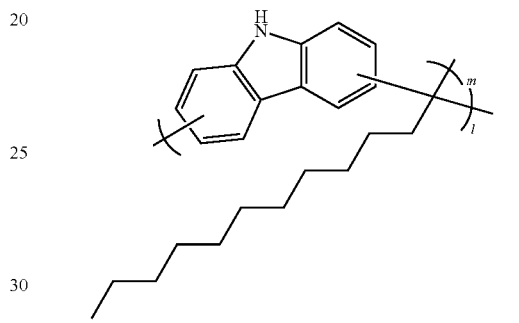

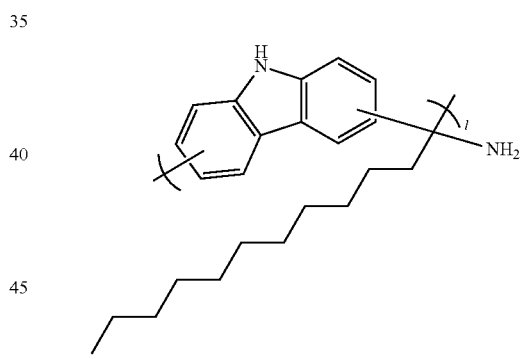

Synthetic Example 34

A 100 mL two-necked flask was loaded with 5.99 g of lauric acid (manufactured by Tokyo Chemical Industry Co., Ltd.), 10.00 g of carbazole (manufactured by Tokyo Chemical Industry Co., Ltd.), 5.96 g of laurylamide (manufactured by Tokyo Chemical Industry Co., Ltd.), 40.41 g of propylene glycol monomethyl ether acetate, 5.75 g of methanesulfonic acid (manufactured by Tokyo Chemical Industry Co., Ltd.), and 12.70 g of 3-mercaptopropionic acid. The mixture was heated to 150° C. and was stirred under reflux for about 26 hours. After the completion of the reaction, the solution was dropped into methanol to cause reprecipitation. The precipitate obtained was suction filtered, and the filter cake was dried under reduced pressure at 60° C. overnight. The polymer obtained corresponded to formula (2-34). The weight average molecular weight Mw measured by GPC in terms of polystyrene was 12,000.

Synthetic Example 35

A 100 mL two-necked flask was loaded with 5.99 g of lauric acid (manufactured by Tokyo Chemical Industry Co., Ltd.), 10.00 g of carbazole (manufactured by Tokyo Chemical Industry Co., Ltd.), 4.55 g of 2-cyclopentylcyclopentanone (manufactured by Tokyo Chemical Industry Co., Ltd.), 26.08 g of propylene glycol monomethyl ether acetate, 1.73 g of methanesulfonic acid (manufactured by Tokyo Chemical Industry Co., Ltd.), and 3.81 g of 3-mercaptopropionic acid. The mixture was heated to 150° C. and was stirred under reflux for about 16 hours. After the completion of the reaction, the solution was dropped into methanol to cause reprecipitation. The precipitate obtained was suction filtered, and the filter cake was dried under reduced pressure at 60° C. overnight. The polymer obtained corresponded to formula (2-35). The weight average molecular weight Mw measured by GPC in terms of polystyrene was 3,600.

[Chemical Formula 45]

Formula (2-35)

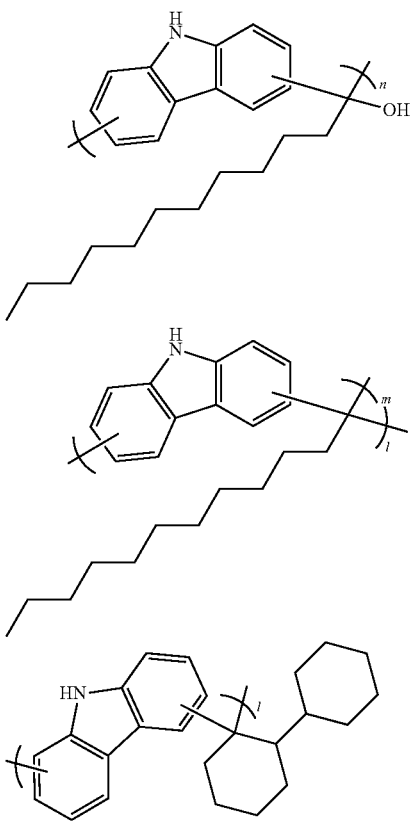

Synthetic Example 36

A 100 mL two-necked flask was loaded with 10.00 g of carbazole (manufactured by Tokyo Chemical Industry Co., Ltd.), 8.14 g of methyl benzoate (manufactured by Tokyo Chemical Industry Co., Ltd.), 26.77 g of propylene glycol monomethyl ether acetate, 8.63 g of methanesulfonic acid (manufactured by Tokyo Chemical Industry Co., Ltd.), and 9.53 g of 3-mercaptopropionic acid. The mixture was heated to 150° C. and was stirred under reflux for about 2 hours. After the completion of the reaction, the solution was dropped into methanol to cause reprecipitation. The precipitate obtained was suction filtered, and the filter cake was dried under reduced pressure at 60° C. overnight. The polymer obtained corresponded to formula (2-36). The weight average molecular weight Mw measured by GPC in terms of polystyrene was 5,900.

[Chemical Formula 46]

Formula (2-36)

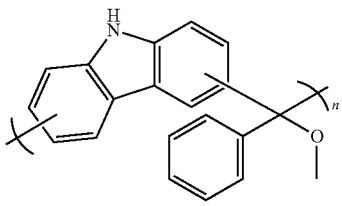

Synthetic Example 37

A 100 mL two-necked flask was loaded with 9.15 g of N,N-diethyl-m-toluamide (manufactured by Tokyo Chemical Industry Co., Ltd.), 10.00 g of carbazole (manufactured by Tokyo Chemical Industry Co., Ltd.), 24.05 g of propylene glycol monomethyl ether acetate, 6.90 g of methanesulfonic acid (manufactured by Tokyo Chemical Industry Co., Ltd.), and 7.62 g of 3-mercaptopropionic acid. The mixture was heated to 150° C. and was stirred under reflux for about 23 hours. After the completion of the reaction, the solution was dropped into methanol to cause reprecipitation. The precipitate obtained was suction filtered, and the filter cake was dried under reduced pressure at 60° C. overnight. The polymer obtained corresponded to formula (2-37). The weight average molecular weight Mw measured by GPC in terms of polystyrene was 1,00,000.

[Chemical Formula 47]

Formula (2-37)

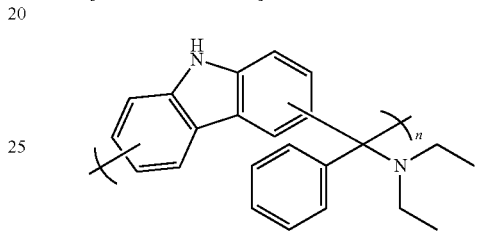

Comparative Synthetic Example 1

A 100 mL two-necked flask was loaded with 4.48 g of benzaldehyde (manufactured by Tokyo Chemical Industry Co., Ltd.), 10.00 g of TEP-TPA (manufactured by ASAHI YUKIZAI CORPORATION), 35.67 g of propylene glycol monomethyl ether, and 0.91 g of methanesulfonic acid (manufactured by Tokyo Chemical Industry Co., Ltd.). The mixture was heated to 150° C. and was stirred under reflux for about 4 hours. After the completion of the reaction, the solution was dropped into a methanol/water solution to cause reprecipitation. The precipitate obtained was suction filtered, and the filter cake was dried under reduced pressure at 60° C. overnight. The polymer obtained corresponded to formula (1-1). The weight average molecular weight Mw measured by GPC in terms of polystyrene was 195,900.

[Chemical Formula 48]

Formula (1-1)

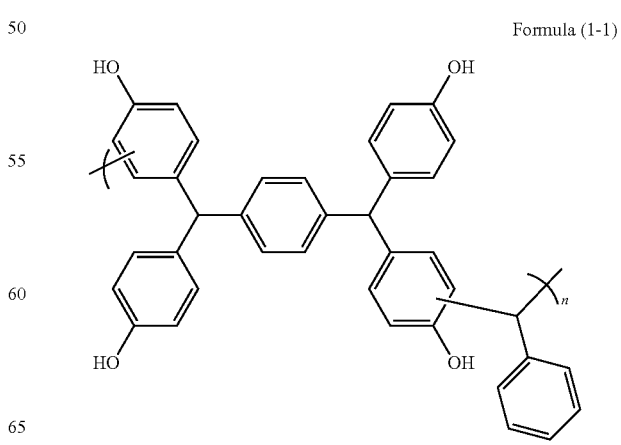

Comparative Synthetic Example 2

A 100 mL two-necked flask was loaded with 8.41 g of benzaldehyde (manufactured by Tokyo Chemical Industry Co., Ltd.), 10.00 g of phloroglucinol (manufactured by Tokyo Chemical Industry Co., Ltd.), 43.86 g of propylene glycol monomethyl ether, and 0.38 g of methanesulfonic acid (manufactured by Tokyo Chemical Industry Co., Ltd.). The mixture was heated to 150° C. and was stirred under reflux for about 4 hours. After the completion of the reaction, the solution was dropped into a methanol/water solution to cause reprecipitation. The precipitate obtained was suction filtered, and the filter cake was dried under reduced pressure at 60° C. overnight. The polymer obtained corresponded to formula (1-2). The weight average molecular weight Mw measured by GPC in terms of polystyrene was 8,100.

[Chemical Formula 49]

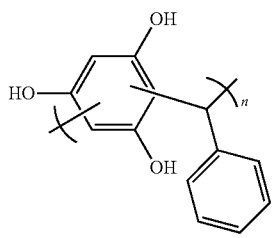

Formula (1-2)

Comparative Synthetic Example 3

A 100 mL two-necked flask was loaded with 5.49 g of benzaldehyde (manufactured by Tokyo Chemical Industry Co., Ltd.), 10.00 g of 2-phenylindole (manufactured by Tokyo Chemical Industry Co., Ltd.), 16.49 g of propylene glycol monomethyl ether acetate, and 0.99 g of methanesulfonic acid (manufactured by Tokyo Chemical Industry Co., Ltd.). The mixture was heated to 150° C. and was stirred under reflux for about 5 hours. After the completion of the reaction, the solution was dropped into methanol to cause reprecipitation. The precipitate obtained was suction filtered, and the filter cake was dried under reduced pressure at 60° C. overnight. The polymer obtained corresponded to formula (1-3). The weight average molecular weight Mw measured by GPC in terms of polystyrene was 1,600.

[Chemical Formula 50]

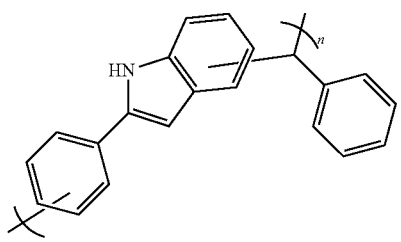

Formula (1-3)

Comparative Synthetic Example 4

A 100 mL two-necked flask was loaded with 4.84 g of benzaldehyde (manufactured by Tokyo Chemical Industry Co., Ltd.), 10.00 g of N-phenyl-1-naphthylamine (manufactured by Tokyo Chemical Industry Co., Ltd.), 36.67 g of propylene glycol monomethyl ether acetate, and 0.88 g of methanesulfonic acid (manufactured by Tokyo Chemical Industry Co., Ltd.). The mixture was heated to 150° C. and was stirred under reflux for about 15 minutes. After the completion of the reaction, the solution was dropped into methanol to cause reprecipitation. The precipitate obtained was suction filtered, and the filter cake was dried under reduced pressure at 60° C. overnight. The polymer obtained corresponded to formula (1-4). The weight average molecular weight Mw measured by GPC in terms of polystyrene was 5,900.

[Chemical Formula 51]

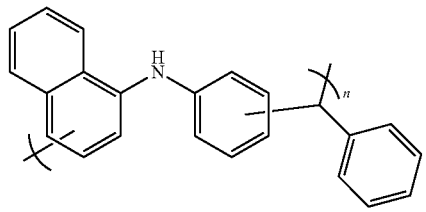

Formula (1-4)

Comparative Synthetic Example

A 100 mL two-necked flask was loaded with 3.03 g of benzaldehyde (manufactured by Tokyo Chemical Industry Co., Ltd.), 10.00 g of 9,9-bis(4-hydroxyphenyl)fluorene (manufactured by Tokyo Chemical Industry Co., Ltd.), 32.68 g of propylene glycol monomethyl ether acetate, and 0.55 g of methanesulfonic acid (manufactured by Tokyo Chemical Industry Co., Ltd.). The mixture was heated to 150° C. and was stirred under reflux for about 17.5 hours. After the completion of the reaction, the solution was dropped into methanol to cause reprecipitation. The precipitate obtained was suction filtered, and the filter cake was dried under reduced pressure at 60° C. overnight. The polymer obtained corresponded to formula (1-5). The weight average molecular weight Mw measured by GPC in terms of polystyrene was 910,300.

[Chemical Formula 52]

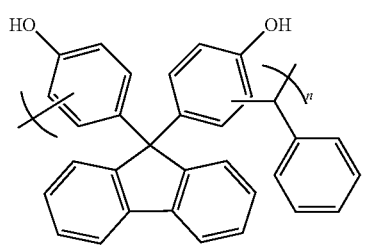

Formula (1-5)

Comparative Synthetic Example 6

A 100 mL two-necked flask was loaded with 6.62 g of benzaldehyde (manufactured by Tokyo Chemical Industry Co., Ltd.), 10.00 g of 1,5-dihydroxynaphthalene (manufactured by Tokyo Chemical Industry Co., Ltd.), 41.58 g of propylene glycol monomethyl ether acetate, and 1.20 g of methanesulfonic acid (manufactured by Tokyo Chemical Industry Co., Ltd.). The mixture was heated to 150° C. and was stirred under reflux for about 1.5 hours. After the completion of the reaction, the solution was dropped into methanol to cause reprecipitation. The precipitate obtained was suction filtered, and the filter cake was dried under reduced pressure at 60° C. overnight. The polymer obtained corresponded to formula (1-6). The weight average molecular weight Mw measured by GPC in terms of polystyrene was 5,300.

[Chemical Formula 53]

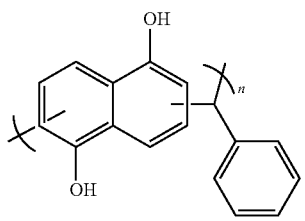

Formula (1-6)

Comparative Synthetic Example 7

A 100 mL two-necked flask was loaded with 6.35 g of benzaldehyde (manufactured by Tokyo Chemical Industry Co., Ltd.), 10.00 g of carbazole (manufactured by Tokyo Chemical Industry Co., Ltd.), 40.84 g of propylene glycol monomethyl ether acetate, and 1.15 g of methanesulfonic acid (manufactured by Tokyo Chemical Industry Co., Ltd.). The mixture was heated to 150° C. and was stirred under reflux for about 30 minutes. After the completion of the reaction, the solution was dropped into methanol to cause reprecipitation. The precipitate obtained was suction filtered, and the filter cake was dried under reduced pressure at 60° C. overnight. The polymer obtained corresponded to formula (1-7). The weight average molecular weight Mw measured by GPC in terms of polystyrene was 52,300.

[Chemical Formula 54]

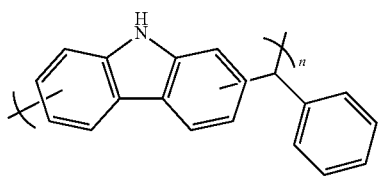

Formula (1-7)

Example 1

The resin obtained in Synthetic Example 1 (i.e., a polymer, the same applies hereinbelow) was dissolved into propylene glycol monomethyl ether/cyclohexanone and was ion-exchanged to give a resin solution (solid content: 15.09% by mass). To 3.32 g of this resin solution were added 0.05 g of propylene glycol monomethyl ether acetate containing 1% surfactant (MEGAFACE R-40 manufactured by DIC CORPORATION), 0.13 g of TMOM-BP (manufactured by Honshu Chemical Industry Co., Ltd.), 0.63 g of propylene glycol monomethyl ether containing 2% by mass of K-PURE [registered trademark] TAG2689 (manufactured by King Industries Inc.), 0.69 g of propylene glycol monomethyl ether acetate, 0.24 g of propylene glycol monomethyl ether, and 2.94 g of cyclohexanone, thereby forming a solution. The solution was filtered through a 0.1 μm polytetrafluoroethylene microfilter. A solution of a resist underlayer film-forming composition was thus prepared.

Example 2

The resin obtained in Synthetic Example 2 was dissolved into propylene glycol monomethyl ether and was ion-exchanged to give a resin solution (solid content: 14.97% by mass). To 3.35 g of this resin solution were added 0.05 g of propylene glycol monomethyl ether acetate containing 1% surfactant (MEGAFACE R-40 manufactured by DIC CORPORATION), 0.13 g of TMOM-BP (manufactured by Honshu Chemical Industry Co., Ltd.), 0.63 g of propylene glycol monomethyl ether containing 2% by mass of K-PURE [registered trademark] TAG2689 (manufactured by King Industries Inc.), 0.69 g of propylene glycol monomethyl ether acetate, 0.22 g of propylene glycol monomethyl ether, and 2.94 g of cyclohexanone, thereby forming a solution. The solution was filtered through a 0.1 μm polytetrafluoroethylene microfilter. A solution of a resist underlayer film-forming composition was thus prepared.

Example 3

The resin obtained in Synthetic Example 3 was dissolved into propylene glycol monomethyl ether and was ion-exchanged to give a resin solution (solid content: 19.92% by mass). To 2.52 g of this resin solution were added 0.05 g of propylene glycol monomethyl ether acetate containing 1% surfactant (MEGAFACE R-40 manufactured by DIC CORPORATION), 0.13 g of TMOM-BP (manufactured by Honshu Chemical Industry Co., Ltd.), 0.63 g of propylene glycol monomethyl ether containing 2% by mass of K-PURE [registered trademark] TAG2689 (manufactured by King Industries Inc.), 2.16 g of propylene glycol monomethyl ether acetate, and 2.52 g of propylene glycol monomethyl ether, thereby forming a solution. The solution was filtered through a 0.1 μm polytetrafluoroethylene microfilter. A solution of a resist underlayer film-forming composition was thus prepared.

Example 4

The resin obtained in Synthetic Example 4 was dissolved into propylene glycol monomethyl ether/cyclohexanone and was ion-exchanged to give a resin solution (solid content: 12.12% by mass). To 3.92 g of this resin solution were added 0.05 g of propylene glycol monomethyl ether acetate containing 1% surfactant (MEGAFACE R-40 manufactured by DIC CORPORATION), 0.14 g of TMOM-BP (manufactured by Honshu Chemical Industry Co., Ltd.), 1.07 g of propylene glycol monomethyl ether containing 2% by mass of K-PURE [registered trademark] TAG2689 (manufactured by King Industries Inc.), 0.69 g of propylene glycol monomethyl ether acetate, 0.29 g of propylene glycol monomethyl ether, and 1.84 g of cyclohexanone, thereby forming a solution. The solution was filtered through a 0.1 μm polytetrafluoroethylene microfilter. A solution of a resist underlayer film-forming composition was thus prepared.

Example 5

The resin obtained in Synthetic Example 5 was dissolved into propylene glycol monomethyl ether and was ion-exchanged to give a resin solution (solid content: 18.50% by mass). To 2.71 g of this resin solution were added 0.05 g of propylene glycol monomethyl ether acetate containing 1% surfactant (MEGAFACE R-40 manufactured by DIC CORPORATION), 0.13 g of TMOM-BP (manufactured by Honshu Chemical Industry Co., Ltd.), 0.63 g of propylene glycol monomethyl ether containing 2% by mass of K-PURE [registered trademark] TAG2689 (manufactured by King Industries Inc.), 2.16 g of propylene glycol monomethyl ether acetate, and 2.33 g of propylene glycol monomethyl ether, thereby forming a solution. The solution was filtered through a 0.1 µm polytetrafluoroethylene microfilter. A solution of a resist underlayer film-forming composition was thus prepared.

Example 6

The resin obtained in Synthetic Example 6 was dissolved into cyclohexanone and was ion-exchanged to give a resin solution (solid content: 18.39% by mass). To 3.38 g of this resin solution were added 0.06 g of propylene glycol monomethyl ether acetate containing 1% surfactant (MEGAFACE R-40 manufactured by DIC CORPORATION), 0.16 g of TMOM-BP (manufactured by Honshu Chemical Industry Co., Ltd.), 1.16 g of propylene glycol monomethyl ether containing 2% by mass of K-PURE [registered trademark] TAG2689 (manufactured by King Industries Inc.), 0.66 g of propylene glycol monomethyl ether acetate, 0.30 g of propylene glycol monomethyl ether, and 2.28 g of cyclohexanone, thereby forming a solution. The solution was filtered through a 0.1 µm polytetrafluoroethylene microfilter. A solution of a resist underlayer film-forming composition was thus prepared.

Example 7

The resin obtained in Synthetic Example 7 was dissolved into cyclohexanone and was ion-exchanged to give a resin solution (solid content: 13.17% by mass). To 4.24 g of this resin solution were added 0.06 g of propylene glycol monomethyl ether acetate containing 1% surfactant (MEGAFACE R-40 manufactured by DIC CORPORATION), 0.14 g of TMOM-BP (manufactured by Honshu Chemical Industry Co., Ltd.), 0.70 g of propylene glycol monomethyl ether containing 2% by mass of K-PURE [registered trademark] TAG2689 (manufactured by King Industries Inc.), 0.67 g of propylene glycol monomethyl ether acetate, 0.01 g of propylene glycol monomethyl ether, and 2.19 g of cyclohexanone, thereby forming a solution. The solution was filtered through a 0.1 µm polytetrafluoroethylene microfilter. A solution of a resist underlayer film-forming composition was thus prepared.

Example 8

The resin obtained in Synthetic Example 8 was dissolved into propylene glycol monomethyl ether and was ion-exchanged to give a resin solution (solid content: 23.18% by mass). To 2.16 g of this resin solution were added 0.05 g of propylene glycol monomethyl ether acetate containing 1% surfactant (MEGAFACE R-40 manufactured by DIC CORPORATION), 0.13 g of TMOM-BP (manufactured by Honshu Chemical Industry Co., Ltd.), 0.63 g of propylene glycol monomethyl ether containing 2% by mass of K-PURE [registered trademark] TAG2689 (manufactured by King Industries Inc.), 2.16 g of propylene glycol monomethyl ether acetate, and 2.88 g of propylene glycol monomethyl ether, thereby forming a solution. The solution was filtered through a 0.1 µm polytetrafluoroethylene microfilter. A solution of a resist underlayer film-forming composition was thus prepared.

Example 9

The resin obtained in Synthetic Example 9 was dissolved into propylene glycol monomethyl ether and was ion-exchanged to give a resin solution (solid content: 17.87% by mass). To 3.33 g of this resin solution were added 0.05 g of propylene glycol monomethyl ether acetate containing 1% surfactant (MEGAFACE R-40 manufactured by DIC CORPORATION), 0.18 g of TMOM-BP (manufactured by Honshu Chemical Industry Co., Ltd.), 1.34 g of propylene glycol monomethyl ether containing 2% by mass of K-PURE [registered trademark] TAG2689 (manufactured by King Industries Inc.), 2.10 g of propylene glycol monomethyl ether acetate, and 1.00 g of propylene glycol monomethyl ether, thereby forming a solution. The solution was filtered through a 0.1 µm polytetrafluoroethylene microfilter. A solution of a resist underlayer film-forming composition was thus prepared.

Example 10

The resin obtained in Synthetic Example 10 was dissolved into propylene glycol monomethyl ether/cyclohexanone and was ion-exchanged to give a resin solution (solid content: 14.60% by mass). To 4.07 g of this resin solution were added 0.06 g of propylene glycol monomethyl ether acetate containing 1% surfactant (MEGAFACE R-40 manufactured by DIC CORPORATION), 0.18 g of TMOM-BP (manufactured by Honshu Chemical Industry Co., Ltd.), 1.34 g of propylene glycol monomethyl ether containing 2% by mass of pyridinium p-hydroxybenzenesulfonate, 0.66 g of propylene glycol monomethyl ether acetate, 0.25 g of propylene glycol monomethyl ether, and 1.44 g of cyclohexanone, thereby forming a solution. The solution was filtered through a 0.1 µm polytetrafluoroethylene microfilter. A solution of a resist underlayer film-forming composition was thus prepared.

Example 11

The resin obtained in Synthetic Example 11 was dissolved into propylene glycol monomethyl ether and was ion-exchanged to give a resin solution (solid content: 16.80% by mass). To 3.73 g of this resin solution were added 0.06 g of propylene glycol monomethyl ether acetate containing 1% surfactant (MEGAFACE R-40 manufactured by DIC CORPORATION), 0.16 g of TMOM-BP (manufactured by Honshu Chemical Industry Co., Ltd.), 0.78 g of propylene glycol monomethyl ether containing 2% by mass of K-PURE [registered trademark] TAG2689 (manufactured by King Industries Inc.), 2.10 g of propylene glycol monomethyl ether acetate, and 1.17 g of propylene glycol monomethyl ether, thereby forming a solution. The solution was filtered through a 0.1 µm polytetrafluoroethylene microfilter. A solution of a resist underlayer film-forming composition was thus prepared.

Example 12

The resin obtained in Synthetic Example 12 was dissolved into cyclohexanone and was ion-exchanged to give a resin solution (solid content: 16.77% by mass). To 3.70 g of this resin solution were added 0.06 g of propylene glycol monomethyl ether acetate containing 1% surfactant (MEGAFACE R-40 manufactured by DIC CORPORATION), 0.16 g of TMOM-BP (manufactured by Honshu Chemical Industry Co., Ltd.), 1.16 g of propylene glycol monomethyl ether containing 2% by mass of K-PURE [registered trademark] TAG2689 (manufactured by King Industries Inc.), 0.66 g of propylene glycol monomethyl ether acetate, 0.30 g of propylene glycol monomethyl ether, and 1.96 g of cyclohexanone, thereby forming a solution. The solution was filtered through a 0.1 μm polytetrafluoroethylene microfilter. A solution of a resist underlayer film-forming composition was thus prepared.

Example 13

The resin obtained in Synthetic Example 13 was dissolved into propylene glycol monomethyl ether and was ion-exchanged to give a resin solution (solid content: 16.67% by mass). To 3.76 g of this resin solution were added 0.06 g of propylene glycol monomethyl ether acetate containing 1% surfactant (MEGAFACE R-40 manufactured by DIC CORPORATION), 0.16 g of TMOM-BP (manufactured by Honshu Chemical Industry Co., Ltd.), 0.78 g of propylene glycol monomethyl ether containing 2% by mass of K-PURE [registered trademark] TAG2689 (manufactured by King Industries Inc.), 2.10 g of propylene glycol monomethyl ether acetate, and 1.14 g of propylene glycol monomethyl ether, thereby forming a solution. The solution was filtered through a 0.1 μm polytetrafluoroethylene microfilter. A solution of a resist underlayer film-forming composition was thus prepared.

Example 14

The resin obtained in Synthetic Example 14 was dissolved into propylene glycol monomethyl ether and was ion-exchanged to give a resin solution (solid content: 16.04% by mass). To 3.13 g of this resin solution were added 0.06 g of propylene glycol monomethyl ether acetate containing 1% surfactant (MEGAFACE R-40 manufactured by DIC CORPORATION), 0.13 g of TMOM-BP (manufactured by Honshu Chemical Industry Co., Ltd.), 0.63 g of propylene glycol monomethyl ether containing 2% by mass of K-PURE [registered trademark] TAG2689 (manufactured by King Industries Inc.), 2.16 g of propylene glycol monomethyl ether acetate, and 1.91 g of propylene glycol monomethyl ether, thereby forming a solution. The solution was filtered through a 0.1 μm polytetrafluoroethylene microfilter. A solution of a resist underlayer film-forming composition was thus prepared.

Example 15

The resin obtained in Synthetic Example 15 was dissolved into propylene glycol monomethyl ether and was ion-exchanged to give a resin solution (solid content: 15.32% by mass). To 4.09 g of this resin solution were added 0.06 g of propylene glycol monomethyl ether acetate containing 1% surfactant (MEGAFACE R-40 manufactured by DIC CORPORATION), 0.16 g of TMOM-BP (manufactured by Honshu Chemical Industry Co., Ltd.), 0.78 g of propylene glycol monomethyl ether containing 2% by mass of K-PURE [registered trademark] TAG2689 (manufactured by King Industries Inc.), 2.10 g of propylene glycol monomethyl ether acetate, and 0.81 g of propylene glycol monomethyl ether, thereby forming a solution. The solution was filtered through a 0.1 μm polytetrafluoroethylene microfilter. A solution of a resist underlayer film-forming composition was thus prepared.

Example 16

The resin obtained in Synthetic Example 16 was dissolved into propylene glycol monomethyl ether and was ion-exchanged to give a resin solution (solid content: 14.70% by mass). To 4.27 g of this resin solution were added 0.06 g of propylene glycol monomethyl ether acetate containing 1% surfactant (MEGAFACE R-40 manufactured by DIC CORPORATION), 0.16 g of TMOM-BP (manufactured by Honshu Chemical Industry Co., Ltd.), 0.78 g of propylene glycol monomethyl ether containing 2% by mass of K-PURE [registered trademark] TAG2689 (manufactured by King Industries Inc.), 2.10 g of propylene glycol monomethyl ether acetate, and 0.63 g of propylene glycol monomethyl ether, thereby forming a solution. The solution was filtered through a 0.1 μm polytetrafluoroethylene microfilter. A solution of a resist underlayer film-forming composition was thus prepared.

Example 17

The resin obtained in Synthetic Example 17 was dissolved into propylene glycol monomethyl ether and was ion-exchanged to give a resin solution (solid content: 18.31% by mass). To 3.42 g of this resin solution were added 0.06 g of propylene glycol monomethyl ether acetate containing 1% surfactant (MEGAFACE R-40 manufactured by DIC CORPORATION), 0.16 g of TMOM-BP (manufactured by Honshu Chemical Industry Co., Ltd.), 0.78 g of propylene glycol monomethyl ether containing 2% by mass of K-PURE [registered trademark] TAG2689 (manufactured by King Industries Inc.), 2.10 g of propylene glycol monomethyl ether acetate, and 1.47 g of propylene glycol monomethyl ether, thereby forming a solution. The solution was filtered through a 0.1 μm polytetrafluoroethylene microfilter. A solution of a resist underlayer film-forming composition was thus prepared.

Example 18

The resin obtained in Synthetic Example 18 was dissolved into propylene glycol monomethyl ether and was ion-exchanged to give a resin solution (solid content: 18.88% by mass). To 3.29 g of this resin solution were added 0.06 g of propylene glycol monomethyl ether acetate containing 1% surfactant (MEGAFACE R-40 manufactured by DIC CORPORATION), 0.16 g of TMOM-BP (manufactured by Honshu Chemical Industry Co., Ltd.), 1.16 g of propylene glycol monomethyl ether containing 2% by mass of K-PURE [registered trademark] TAG2689 (manufactured by King Industries Inc.), 2.10 g of propylene glycol monomethyl ether acetate, and 1.23 g of propylene glycol monomethyl ether, thereby forming a solution. The solution was filtered through a 0.1 μm polytetrafluoroethylene microfilter. A solution of a resist underlayer film-forming composition was thus prepared.

Example 19

The resin obtained in Synthetic Example 19 was dissolved into propylene glycol monomethyl ether acetate and was ion-exchanged to give a resin solution (solid content: 18.60% by mass). To 3.37 g of this resin solution were added 0.06 g of propylene glycol monomethyl ether acetate containing 1% surfactant (MEGAFACE R-40 manufactured by DIC CORPORATION), 0.16 g of TMOM-BP (manufactured by Honshu Chemical Industry Co., Ltd.), 0.78 g of propylene glycol monomethyl ether containing 2% by mass of K-PURE [registered trademark] TAG2689 (manufactured by King Industries Inc.), 2.23 g of propylene glycol monomethyl ether acetate, and 1.39 g of propylene glycol monomethyl ether, thereby forming a solution. The solution was filtered through a 0.1 µm polytetrafluoroethylene microfilter. A solution of a resist underlayer film-forming composition was thus prepared.

Example 20

The resin obtained in Synthetic Example 20 was dissolved into propylene glycol monomethyl ether and was ion-exchanged to give a resin solution (solid content: 15.24% by mass). To 3.29 g of this resin solution were added 0.06 g of propylene glycol monomethyl ether acetate containing 1% surfactant (MEGAFACE R-40 manufactured by DIC CORPORATION), 0.13 g of TMOM-BP (manufactured by Honshu Chemical Industry Co., Ltd.), 0.63 g of propylene glycol monomethyl ether containing 2% by mass of K-PURE [registered trademark] TAG2689 (manufactured by King Industries Inc.), 2.16 g of propylene glycol monomethyl ether acetate, and 1.75 g of propylene glycol monomethyl ether, thereby forming a solution. The solution was filtered through a 0.1 µm polytetrafluoroethylene microfilter. A solution of a resist underlayer film-forming composition was thus prepared.

Example 21

The resin obtained in Synthetic Example 21 was dissolved into propylene glycol monomethyl ether/cyclohexanone and was ion-exchanged to give a resin solution (solid content: 12.85% by mass). To 4.24 g of this resin solution were added 0.05 g of propylene glycol monomethyl ether acetate containing 1% surfactant (MEGAFACE R-40 manufactured by DIC CORPORATION), 0.14 g of TMOM-BP (manufactured by Honshu Chemical Industry Co., Ltd.), 0.68 g of propylene glycol monomethyl ether containing 2% by mass of K-PURE [registered trademark] TAG2689 (manufactured by King Industries Inc.), 0.68 g of propylene glycol monomethyl ether acetate, 0.01 g of propylene glycol monomethyl ether, and 2.19 g of cyclohexanone, thereby forming a solution. The solution was filtered through a 0.1 µm polytetrafluoroethylene microfilter. A solution of a resist underlayer film-forming composition was thus prepared.

Example 22

The resin obtained in Synthetic Example 22 was dissolved into propylene glycol monomethyl ether and was ion-exchanged to give a resin solution (solid content: 14.01% by mass). To 4.43 g of this resin solution were added 0.06 g of propylene glycol monomethyl ether acetate containing 1% surfactant (MEGAFACE R-40 manufactured by DIC CORPORATION), 0.16 g of TMOM-BP (manufactured by Honshu Chemical Industry Co., Ltd.), 1.16 g of propylene glycol monomethyl ether containing 2% by mass of K-PURE [registered trademark] TAG2689 (manufactured by King Industries Inc.), 2.10 g of propylene glycol monomethyl ether acetate, and 0.09 g of propylene glycol monomethyl ether, thereby forming a solution. The solution was filtered through a 0.1 µm polytetrafluoroethylene microfilter. A solution of a resist underlayer film-forming composition was thus prepared.

Example 23

The resin obtained in Synthetic Example 23 was dissolved into propylene glycol monomethyl ether and was ion-exchanged to give a resin solution (solid content: 18.38% by mass). To 3.41 g of this resin solution were added 0.06 g of propylene glycol monomethyl ether acetate containing 1% surfactant (MEGAFACE R-40 manufactured by DIC CORPORATION), 0.16 g of TMOM-BP (manufactured by Honshu Chemical Industry Co., Ltd.), 0.78 g of propylene glycol monomethyl ether containing 2% by mass of K-PURE [registered trademark] TAG2689 (manufactured by King Industries Inc.), 2.19 g of propylene glycol monomethyl ether acetate, and 1.39 g of propylene glycol monomethyl ether, thereby forming a solution. The solution was filtered through a 0.1 µm polytetrafluoroethylene microfilter. A solution of a resist underlayer film-forming composition was thus prepared.

Example 24

The resin obtained in Synthetic Example 24 was dissolved into propylene glycol monomethyl ether and was ion-exchanged to give a resin solution (solid content: 14.87% by mass). To 4.18 g of this resin solution were added 0.06 g of propylene glycol monomethyl ether acetate containing 1% surfactant (MEGAFACE R-40 manufactured by DIC CORPORATION), 0.16 g of TMOM-BP (manufactured by Honshu Chemical Industry Co., Ltd.), 1.16 g of propylene glycol monomethyl ether containing 2% by mass of K-PURE [registered trademark] TAG2689 (manufactured by King Industries Inc.), 2.10 g of propylene glycol monomethyl ether acetate, and 0.34 g of propylene glycol monomethyl ether, thereby forming a solution. The solution was filtered through a 0.1 µm polytetrafluoroethylene microfilter. A solution of a resist underlayer film-forming composition was thus prepared.

Example 25

The resin obtained in Synthetic Example 25 was dissolved into propylene glycol monomethyl ether acetate and was ion-exchanged to give a resin solution (solid content: 16.00% by mass). To 3.92 g of this resin solution were added 0.06 g of propylene glycol monomethyl ether acetate containing 1% surfactant (MEGAFACE R-40 manufactured by DIC CORPORATION), 0.16 g of TMOM-BP (manufactured by Honshu Chemical Industry Co., Ltd.), 0.78 g of propylene glycol monomethyl ether containing 2% by mass of K-PURE [registered trademark] TAG2689 (manufactured by King Industries Inc.), 1.69 g of propylene glycol monomethyl ether acetate, and 1.39 g of propylene glycol monomethyl ether, thereby forming a solution. The solution was filtered through a 0.1 µm polytetrafluoroethylene microfilter. A solution of a resist underlayer film-forming composition was thus prepared.

Example 26

The resin obtained in Synthetic Example 26 was dissolved into propylene glycol monomethyl ether acetate/cyclohexanone and was ion-exchanged to give a resin solution (solid content: 7.78% by mass). To 5.64 g of this resin solution were added 0.06 g of propylene glycol monomethyl ether acetate containing 1% surfactant (MEGAFACE R-40 manufactured by DIC CORPORATION), 0.11 g of TMOM-BP (manufactured by Honshu Chemical Industry Co., Ltd.), 0.55 g of propylene glycol monomethyl ether containing 2% by mass of K-PURE [registered trademark] TAG2689 (manufactured by King Industries Inc.), 0.70 g of propylene glycol monomethyl ether acetate, 0.28 g of propylene glycol monomethyl ether, and 0.67 g of cyclohexanone, thereby forming a solution. The solution was filtered through a 0.1 μm polytetrafluoroethylene microfilter. A solution of a resist underlayer film-forming composition was thus prepared.

Example 27

The resin obtained in Synthetic Example 27 was dissolved into propylene glycol monomethyl ether/cyclohexanone and was ion-exchanged to give a resin solution (solid content: 10.34% by mass). To 4.42 g of this resin solution were added 0.06 g of propylene glycol monomethyl ether acetate containing 1% surfactant (MEGAFACE R-40 manufactured by DIC CORPORATION), 0.18 g of PGME-BIP-A (manufactured by Finechem), 0.55 g of propylene glycol monomethyl ether containing 2% by mass of pyridinium p-hydroxybenzenesulfonate, 0.70 g of propylene glycol monomethyl ether acetate, 0.05 g of propylene glycol monomethyl ether, and 2.25 g of cyclohexanone, thereby forming a solution. The solution was filtered through a 0.1 μm polytetrafluoroethylene microfilter. A solution of a resist underlayer film-forming composition was thus prepared.

Example 28

The resin obtained in Synthetic Example 28 was dissolved into propylene glycol monomethyl ether/cyclohexanone and was ion-exchanged to give a resin solution (solid content: 7.76% by mass). To 5.66 g of this resin solution were added 0.04 g of propylene glycol monomethyl ether acetate containing 1% surfactant (MEGAFACE R-40 manufactured by DIC CORPORATION), 0.11 g of PL-LI (manufactured by Midori Kagaku Co., Ltd.), 0.55 g of propylene glycol monomethyl ether containing 2% by mass of pyridinium benzenesulfonate, 0.70 g of propylene glycol monomethyl ether acetate, 0.27 g of propylene glycol monomethyl ether, and 0.63 g of cyclohexanone, thereby forming a solution. The solution was filtered through a 0.1 μm polytetrafluoroethylene microfilter. A solution of a resist underlayer film-forming composition was thus prepared.

Example 29

The resin obtained in Synthetic Example 29 was dissolved into propylene glycol monomethyl ether acetate and was ion-exchanged to give a resin solution (solid content: 21.58% by mass). To 2.76 g of this resin solution were added 0.06 g of propylene glycol monomethyl ether acetate containing 1% surfactant (MEGAFACE R-40 manufactured by DIC CORPORATION), 0.16 g of TMOM-BP (manufactured by Honshu Chemical Industry Co., Ltd.), 1.16 g of propylene glycol monomethyl ether containing 2% by mass of K-PURE [registered trademark] TAG2689 (manufactured by King Industries Inc.), 4.98 g of propylene glycol monomethyl ether acetate, and 1.02 g of propylene glycol monomethyl ether, thereby forming a solution. The solution was filtered through a 0.1 μm polytetrafluoroethylene microfilter. A solution of a resist underlayer film-forming composition was thus prepared.

Example 30

The resin obtained in Synthetic Example 30 was dissolved into cyclohexanone and was ion-exchanged to give a resin solution (solid content: 22.47% by mass). To 2.76 g of this resin solution were added 0.06 g of propylene glycol monomethyl ether acetate containing 1% surfactant (MEGAFACE R-40 manufactured by DIC CORPORATION), 0.16 g of TMOM-BP (manufactured by Honshu Chemical Industry Co., Ltd.), 1.16 g of propylene glycol monomethyl ether containing 2% by mass of K-PURE [registered trademark] TAG2689 (manufactured by King Industries Inc.), 0.66 g of propylene glycol monomethyl ether acetate, 0.30 g of propylene glycol monomethyl ether, and 2.90 g of cyclohexanone, thereby forming a solution. The solution was filtered through a 0.1 μm polytetrafluoroethylene microfilter. A solution of a resist underlayer film-forming composition was thus prepared.

Example 31

The resin obtained in Synthetic Example 31 was dissolved into propylene glycol monomethyl ether acetate and was ion-exchanged to give a resin solution (solid content: 17.34% by mass). To 3.62 g of this resin solution were added 0.06 g of propylene glycol monomethyl ether acetate containing 1% surfactant (MEGAFACE R-40 manufactured by DIC CORPORATION), 0.16 g of TMOM-BP (manufactured by Honshu Chemical Industry Co., Ltd.), 0.78 g of propylene glycol monomethyl ether containing 2% by mass of K-PURE [registered trademark] TAG2689 (manufactured by King Industries Inc.), 1.99 g of propylene glycol monomethyl ether acetate, and 1.39 g of propylene glycol monomethyl ether, thereby forming a solution. The solution was filtered through a 0.1 μm polytetrafluoroethylene microfilter. A solution of a resist underlayer film-forming composition was thus prepared.

Example 32

The resin obtained in Synthetic Example 32 was dissolved into propylene glycol monomethyl ether acetate and was ion-exchanged to give a resin solution (solid content: 20.25% by mass). To 3.10 g of this resin solution were added 0.06 g of propylene glycol monomethyl ether acetate containing 1% surfactant (MEGAFACE R-40 manufactured by DIC CORPORATION), 0.16 g of TMOM-BP (manufactured by Honshu Chemical Industry Co., Ltd.), 0.78 g of propylene glycol monomethyl ether containing 2% by mass of K-PURE [registered trademark] TAG2689 (manufactured by King Industries Inc.), 2.51 g of propylene glycol monomethyl ether acetate, and 1.39 g of propylene glycol monomethyl ether, thereby forming a solution. The solution was filtered through a 0.1 μm polytetrafluoroethylene microfilter. A solution of a resist underlayer film-forming composition was thus prepared.

Example 33

The resin obtained in Synthetic Example 33 was dissolved into propylene glycol monomethyl ether acetate and was ion-exchanged to give a resin solution (solid content: 23.01% by mass). To 2.72 g of this resin solution were added 0.06 g of propylene glycol monomethyl ether acetate containing 1% surfactant (MEGAFACE R-40 manufactured by DIC CORPORATION), 0.16 g of TMOM-BP (manufactured by Honshu Chemical Industry Co., Ltd.), 0.78 g of propylene glycol monomethyl ether containing 2% by mass of K-PURE [registered trademark] TAG2689 (manufactured by King Industries Inc.), 2.88 g of propylene glycol monomethyl ether acetate, and 1.39 g of propylene glycol monomethyl ether, thereby forming a solution. The solution was filtered through a 0.1 μm polytetrafluoroethylene microfilter. A solution of a resist underlayer film-forming composition was thus prepared.

Example 34

The resin obtained in Synthetic Example 34 was dissolved into propylene glycol monomethyl ether acetate and was ion-exchanged to give a resin solution (solid content: 22.16% by mass). To 2.83 g of this resin solution were added 0.06 g of propylene glycol monomethyl ether acetate containing 1% surfactant (MEGAFACE R-40 manufactured by DIC CORPORATION), 0.16 g of TMOM-BP (manufactured by Honshu Chemical Industry Co., Ltd.), 0.78 g of propylene glycol monomethyl ether containing 2% by mass of K-PURE [registered trademark] TAG2689 (manufactured by King Industries Inc.), 2.78 g of propylene glycol monomethyl ether acetate, and 1.39 g of propylene glycol monomethyl ether, thereby forming a solution. The solution was filtered through a 0.1 μm polytetrafluoroethylene microfilter. A solution of a resist underlayer film-forming composition was thus prepared.

Example 35

The resin obtained in Synthetic Example 35 was dissolved into cyclohexanone and was ion-exchanged to give a resin solution (solid content: 22.88% by mass). To 2.38 g of this resin solution were added 0.06 g of propylene glycol monomethyl ether acetate containing 1% surfactant (MEGAFACE R-40 manufactured by DIC CORPORATION), 0.14 g of TMOM-BP (manufactured by Honshu Chemical Industry Co., Ltd.), 0.68 g of propylene glycol monomethyl ether containing 2% by mass of K-PURE [registered trademark] TAG2689 (manufactured by King Industries Inc.), 0.68 g of propylene glycol monomethyl ether acetate, 0.79 g of propylene glycol monomethyl ether, and 3.27 g of cyclohexanone, thereby forming a solution. The solution was filtered through a 0.1 μm polytetrafluoroethylene microfilter. A solution of a resist underlayer film-forming composition was thus prepared.

Example 36

The resin obtained in Synthetic Example 36 was dissolved into propylene glycol monomethyl ether acetate and was ion-exchanged to give a resin solution (solid content: 20.81% by mass). To 3.39 g of this resin solution were added 0.07 g of propylene glycol monomethyl ether acetate containing 1% surfactant (MEGAFACE R-40 manufactured by DIC CORPORATION), 0.18 g of TMOM-BP (manufactured by Honshu Chemical Industry Co., Ltd.), 0.88 g of propylene glycol monomethyl ether containing 2% by mass of K-PURE [registered trademark] TAG2689 (manufactured by King Industries Inc.), 3.62 g of propylene glycol monomethyl ether acetate, and 1.89 g of propylene glycol monomethyl ether, thereby forming a solution. The solution was filtered through a 0.1 μm polytetrafluoroethylene microfilter. A solution of a resist underlayer film-forming composition was thus prepared.

Example 37

The resin obtained in Synthetic Example 36 was dissolved into propylene glycol monomethyl ether acetate and was ion-exchanged to give a resin solution (solid content: 20.81% by mass). To 3.39 g of this resin solution were added 0.07 g of propylene glycol monomethyl ether acetate containing 1% surfactant (MEGAFACE R-40 manufactured by DIC CORPORATION), 0.18 g of TMOM-BP (manufactured by Honshu Chemical Industry Co., Ltd.), 0.88 g of propylene glycol monomethyl ether containing 2% by mass of K-PURE [registered trademark] TAG2689 (manufactured by King Industries Inc.), 3.62 g of propylene glycol monomethyl ether acetate, 0.96 g of propylene glycol monomethyl ether, and 0.91 g of N,N-dimethylisobutyramide, thereby forming a solution. The solution was filtered through a 0.1 μm polytetrafluoroethylene microfilter. A solution of a resist underlayer film-forming composition was thus prepared.

Example 38

The resin obtained in Synthetic Example 37 was dissolved into cyclohexanone and was ion-exchanged to give a resin solution (solid content: 17.92% by mass). To 3.50 g of this resin solution were added 0.07 g of propylene glycol monomethyl ether acetate containing 1% surfactant (MEGAFACE R-40 manufactured by DIC CORPORATION), 0.17 g of TMOM-BP (manufactured by Honshu Chemical Industry Co., Ltd.), 0.85 g of propylene glycol monomethyl ether containing 2% by mass of K-PURE [registered trademark] TAG2689 (manufactured by King Industries Inc.), 3.58 g of propylene glycol monomethyl ether acetate, 0.08 g of propylene glycol monomethyl ether, and 1.44 g of cyclohexanone, thereby forming a solution. The solution was filtered through a 0.1 μm polytetrafluoroethylene microfilter. A solution of a resist underlayer film-forming composition was thus prepared.

Comparative Example 1

The resin obtained in Comparative Synthetic Example 1 was dissolved into propylene glycol monomethyl ether and was ion-exchanged to give a resin solution (solid content: 15.22% by mass). To 4.12 g of this resin solution were added 0.06 g of propylene glycol monomethyl ether acetate containing 1% surfactant (MEGAFACE R-40 manufactured by DIC CORPORATION), 0.16 g of TMOM-BP (manufactured by Honshu Chemical Industry Co., Ltd.), 0.78 g of propylene glycol monomethyl ether containing 2% by mass of K-PURE [registered trademark] TAG2689 (manufactured by King Industries Inc.), 2.70 g of propylene glycol monomethyl ether acetate, and 2.18 g of propylene glycol monomethyl ether, thereby forming a solution. The solution was filtered through a 0.1 μm polytetrafluoroethylene microfilter. A solution of a resist underlayer film-forming composition was thus prepared.

Comparative Example 2

The resin obtained in Comparative Synthetic Example 2 was dissolved into propylene glycol monomethyl ether and was ion-exchanged to give a resin solution (solid content: 16.80% by mass). To 3.73 g of this resin solution were added 0.06 g of propylene glycol monomethyl ether acetate containing 1% surfactant (MEGAFACE R-40 manufactured by DIC CORPORATION), 0.16 g of TMOM-BP (manufactured by Honshu Chemical Industry Co., Ltd.), 0.78 g of propylene glycol monomethyl ether containing 2% by mass of K-PURE [registered trademark] TAG2689 (manufactured by King Industries Inc.), 2.70 g of propylene glycol monomethyl ether acetate, and 2.57 g of propylene glycol monomethyl ether, thereby forming a solution. The solution was filtered through a 0.1 μm polytetrafluoroethylene microfilter. A solution of a resist underlayer film-forming composition was thus prepared.

Comparative Example 3

The resin obtained in Comparative Synthetic Example 3 was dissolved into propylene glycol monomethyl ether acetate and was ion-exchanged to give a resin solution (solid content: 22.51% by mass). To 1.77 g of this resin solution were added 0.06 g of propylene glycol monomethyl ether acetate containing 1% surfactant (MEGAFACE R-40 manufactured by DIC CORPORATION), 0.14 g of TMOM-BP (manufactured by Honshu Chemical Industry Co., Ltd.), 1.05 g of propylene glycol monomethyl ether containing 2% by mass of K-PURE [registered trademark] TAG2689 (manufactured by King Industries Inc.), 3.09 g of propylene glycol monomethyl ether acetate, and 0.91 g of propylene glycol monomethyl ether, thereby forming a solution. The solution was filtered through a 0.1 μm polytetrafluoroethylene microfilter. A solution of a resist underlayer film-forming composition was thus prepared.

Comparative Example 4

The resin obtained in Comparative Synthetic Example 4 was dissolved into cyclohexanone and was ion-exchanged to give a resin solution (solid content: 17.72% by mass). To 3.54 g of this resin solution were added 0.06 g of propylene glycol monomethyl ether acetate containing 1% surfactant (MEGAFACE R-40 manufactured by DIC CORPORATION), 0.16 g of TMOM-BP (manufactured by Honshu Chemical Industry Co., Ltd.), 0.78 g of propylene glycol monomethyl ether containing 2% by mass of K-PURE [registered trademark] TAG2689 (manufactured by King Industries Inc.), 0.86 g of propylene glycol monomethyl ether acetate, 1.07 g of propylene glycol monomethyl ether, and 3.53 g of cyclohexanone, thereby forming a solution. The solution was filtered through a 0.1 μm polytetrafluoroethylene microfilter. A solution of a resist underlayer film-forming composition was thus prepared.

Comparative Example 5

The resin obtained in Comparative Synthetic Example 5 was dissolved into propylene glycol monomethyl ether acetate and was ion-exchanged to give a resin solution (solid content: 15.86% by mass). To 3.95 g of this resin solution were added 0.06 g of propylene glycol monomethyl ether acetate containing 1% surfactant (MEGAFACE R-40 manufactured by DIC CORPORATION), 0.16 g of TMOM-BP (manufactured by Honshu Chemical Industry Co., Ltd.), 0.78 g of propylene glycol monomethyl ether containing 2% by mass of K-PURE [registered trademark] TAG2689 (manufactured by King Industries Inc.), 3.05 g of propylene glycol monomethyl ether acetate, and 1.99 g of propylene glycol monomethyl ether, thereby forming a solution. The solution was filtered through a 0.1 μm polytetrafluoroethylene microfilter. A solution of a resist underlayer film-forming composition was thus prepared.

Comparative Example 6

The resin obtained in Comparative Synthetic Example 6 was dissolved into propylene glycol monomethyl ether and was ion-exchanged to give a resin solution (solid content: 18.21% by mass). To 3.44 g of this resin solution were added 0.06 g of propylene glycol monomethyl ether acetate containing 1% surfactant (MEGAFACE R-40 manufactured by DIC CORPORATION), 0.16 g of TMOM-BP (manufactured by Honshu Chemical Industry Co., Ltd.), 0.78 g of propylene glycol monomethyl ether containing 2% by mass of K-PURE [registered trademark] TAG2689 (manufactured by King Industries Inc.), 2.70 g of propylene glycol monomethyl ether acetate, and 2.86 g of propylene glycol monomethyl ether, thereby forming a solution. The solution was filtered through a 0.1 μm polytetrafluoroethylene microfilter. A solution of a resist underlayer film-forming composition was thus prepared.

Comparative Example 7

The resin obtained in Comparative Synthetic Example 7 was dissolved into propylene glycol monomethyl ether acetate and was ion-exchanged to give a resin solution (solid content: 18.38% by mass). To 3.41 g of this resin solution were added 0.06 g of propylene glycol monomethyl ether acetate containing 1% surfactant (MEGAFACE R-40 manufactured by DIC CORPORATION), 0.16 g of TMOM-BP (manufactured by Honshu Chemical Industry Co., Ltd.), 0.78 g of propylene glycol monomethyl ether containing 2% by mass of K-PURE [registered trademark] TAG2689 (manufactured by King Industries Inc.), 3.59 g of propylene glycol monomethyl ether acetate, and 1.99 g of propylene glycol monomethyl ether, thereby forming a solution. The solution was filtered through a 0.1 μm polytetrafluoroethylene microfilter. A solution of a resist underlayer film-forming composition was thus prepared.

[Test of Dissolution of Resists into Solvents]

Each of the solutions of resist underlayer film-forming compositions prepared in Comparative Examples 1 to 7 and Examples 1 to 30 was applied onto a silicon wafer using a spin coater, and the coating was baked on a hot plate at 250° C. for 60 seconds to form a resist underlayer film (film thickness: 0.20 μm). Each of these resist underlayer films was soaked in solvents used for resists, specifically, ethyl lactate, propylene glycol monomethyl ether, propylene glycol monomethyl ether acetate, and cyclohexanone. The resist underlayer films were insoluble in any of these solvents.

[Measurement of Optical Constants]

Each of the solutions of resist underlayer film-forming compositions prepared in Comparative Examples 1 to 7 and Examples 1 to 38 was applied onto a silicon wafer using a spin coater, and the coating was baked on a hot plate at 250° C. for 60 seconds to form a resist underlayer film (film thickness: 0.05 μm). These resist underlayer films were analyzed with a spectroscopic ellipsometer to measure the refractive index (n value) and the optical absorption coefficient (also called the k value or the attenuation coefficient) at a wavelength of 193 nm. The results are shown in Table 1.

TABLE 1

| Refractive index n and optical absorption coefficient k | | |
|---|---|---|
| | | n/k 193 nm |
| Example 1 | 250° C. Baked film | 1.38/0.71 |
| Example 2 | 250° C. Baked film | 1.38/0.70 |
| Example 3 | 250° C. Baked film | 1.63/0.41 |
| Example 4 | 250° C. Baked film | 1.43/0.37 |
| Example 5 | 250° C. Baked film | 1.39/0.58 |

TABLE 1-continued

Refractive index n and optical absorption coefficient k

| | | n/k 193 nm |
|---|---|---|
| Example 6 | 250° C. Baked film | 1.49/0.25 |
| Example 7 | 250° C. Baked film | 1.55/0.28 |
| Example 8 | 250° C. Baked film | 1.37/0.72 |
| Example 9 | 250° C. Baked film | 1.60/0.41 |
| Example 10 | 250° C. Baked film | 1.45/0.36 |
| Example 11 | 250° C. Baked film | 1.39/0.57 |
| Example 12 | 250° C. Baked film | 1.48/0.25 |
| Example 13 | 250° C. Baked film | 1.47/0.34 |
| Example 14 | 250° C. Baked film | 1.39/0.74 |
| Example 15 | 250° C. Baked film | 1.64/0.40 |
| Example 16 | 250° C. Baked film | 1.47/0.33 |
| Example 17 | 250° C. Baked film | 1.39/0.53 |
| Example 18 | 250° C. Baked film | 1.49/0.25 |
| Example 19 | 250° C. Baked film | 1.55/0.27 |
| Example 20 | 250° C. Baked film | 1.38/0.71 |
| Example 21 | 250° C. Baked film | 1.43/0.40 |
| Example 22 | 250° C. Baked film | 1.51/0.30 |
| Example 23 | 250° C. Baked film | 1.39/0.52 |
| Example 24 | 250° C. Baked film | 1.51/0.23 |
| Example 25 | 250° C. Baked film | 1.54/0.27 |
| Example 26 | 250° C. Baked film | 1.58/0.27 |
| Example 27 | 250° C. Baked film | 1.52/0.34 |
| Example 28 | 250° C. Baked film | 1.61/0.26 |
| Example 29 | 250° C. Baked film | 1.55/0.30 |
| Example 30 | 250° C. Baked film | 1.55/0.29 |
| Example 31 | 250° C. Baked film | 1.48/0.43 |
| Example 32 | 250° C. Baked film | 1.49/0.33 |
| Example 33 | 250° C. Baked film | 1.37/0.38 |
| Example 34 | 250° C. Baked film | 1.48/0.33 |
| Example 35 | 250° C. Baked film | 1.56/0.25 |
| Example 36 | 250° C. Baked film | 1.62/0.27 |
| Example 37 | 250° C. Baked film | 1.62/0.27 |
| Example 38 | 250° C. Baked film | 1.60/0.26 |
| Comparative Example 1 | 250° C. Baked film | 1.42/0.83 |
| Comparative Example 2 | 250° C. Baked film | 1.51/0.74 |
| Comparative Example 3 | 250° C. Baked film | 1.56/0.73 |
| Comparative Example 4 | 250° C. Baked film | 1.45/0.66 |
| Comparative Example 5 | 250° C. Baked film | 1.43/0.71 |
| Comparative Example 6 | 250° C. Baked film | 1.54/0.57 |
| Comparative Example 7 | 250° C. Baked film | 1.52/0.64 |

[Measurement of Dry Etching Rate]

The dry etching rate was measured using the following etcher and etching gas: RIE-10NR (manufactured by Samco) and $CF_4$ Each of the solutions of resist underlayer film-forming compositions prepared in Comparative Examples 1 to 7 and Examples 1 to 38 was applied onto a silicon wafer using a spin coater, and the coating was baked on a hot plate at 250° C. for 60 seconds to form a resist underlayer film (film thickness: 0.20 μm). The dry etching rate was measured using $CF_4$ gas as the etching gas. The dry etching rate of the resist underlayer films of Comparative Examples 1 to 7 and Examples 1 to 32 was compared. The results are shown in Table 2. The dry etching rate is expressed as the dry etching rate ratio (resist underlayer film)/(KrF photoresist).

TABLE 2

Dry etching rate ratio

| | | Etching rate |
|---|---|---|
| Example 1 | 250° C. Baked film | 0.96 |
| Example 2 | 250° C. Baked film | 0.94 |
| Example 3 | 250° C. Baked film | 0.93 |
| Example 4 | 250° C. Baked film | 0.92 |
| Example 5 | 250° C. Baked film | 0.91 |
| Example 6 | 250° C. Baked film | 1.06 |
| Example 7 | 250° C. Baked film | 0.95 |

TABLE 2-continued

Dry etching rate ratio

| | | Etching rate |
|---|---|---|
| Example 8 | 250° C. Baked film | 0.90 |
| Example 9 | 250° C. Baked film | 0.96 |
| Example 10 | 250° C. Baked film | 0.95 |
| Example 11 | 250° C. Baked film | 0.92 |
| Example 12 | 250° C. Baked film | 1.06 |
| Example 13 | 250° C. Baked film | 0.91 |
| Example 14 | 250° C. Baked film | 1.05 |
| Example 15 | 250° C. Baked film | 0.93 |
| Example 16 | 250° C. Baked film | 0.95 |
| Example 17 | 250° C. Baked film | 0.91 |
| Example 18 | 250° C. Baked film | 1.06 |
| Example 19 | 250° C. Baked film | 0.96 |
| Example 20 | 250° C. Baked film | 0.90 |
| Example 21 | 250° C. Baked film | 0.96 |
| Example 22 | 250° C. Baked film | 0.89 |
| Example 23 | 250° C. Baked film | 0.90 |
| Example 24 | 250° C. Baked film | 1.07 |
| Example 25 | 250° C. Baked film | 0.96 |
| Example 26 | 250° C. Baked film | 0.85 |
| Example 27 | 250° C. Baked film | 0.83 |
| Example 28 | 250° C. Baked film | 0.90 |
| Example 29 | 250° C. Baked film | 0.99 |
| Example 30 | 250° C. Baked film | 0.99 |
| Example 31 | 250° C. Baked film | 0.92 |
| Example 32 | 250° C. Baked film | 0.89 |
| Example 33 | 250° C. Baked film | 0.79 |
| Example 34 | 250° C. Baked film | 0.88 |
| Example 35 | 250° C. Baked film | 0.90 |
| Example 36 | 250° C. Baked film | 1.02 |
| Example 37 | 250° C. Baked film | 1.02 |
| Example 38 | 250° C. Baked film | 1.02 |
| Comparative Example 1 | 250° C. Baked film | 0.93 |
| Comparative Example 2 | 250° C. Baked film | 1.01 |
| Comparative Example 3 | 250° C. Baked film | 0.80 |
| Comparative Example 4 | 250° C. Baked film | 0.84 |
| Comparative Example 5 | 250° C. Baked film | 0.86 |
| Comparative Example 6 | 250° C. Baked film | 0.87 |
| Comparative Example 7 | 250° C. Baked film | 0.83 |

[Evaluation of Filling Properties]

Filling properties were evaluated using a 200 nm thick $SiO_2$ substrate. Each of the resist underlayer film-forming compositions prepared in Comparative Examples 1 and 2, and Example 1 to 38 was applied to dense pattern area of a substrate consisting of 50 nm wide trenches at 100 nm pitches, and the coating was baked at 250° C. for 60 seconds to form resist underlayer film having a thickness of about 200 nm. The flatness of the substrates was evaluated using a scanning electron microscope (S4800) manufactured by Hitachi High-Tech Corporation by confirming whether the resist underlayer film-forming composition filled the inside of the pattern (Table 3). Good filling properties are indicated by ◯, and poor filling properties are shown by x.

TABLE 3

Evaluation of filling properties

| | | Filling properties |
|---|---|---|
| Example 1 | 250° C. Baked film | ◯ |
| Example 2 | 250° C. Baked film | ◯ |
| Example 3 | 250° C. Baked film | ◯ |
| Example 4 | 250° C. Baked film | ◯ |
| Example 5 | 250° C. Baked film | ◯ |
| Example 6 | 250° C. Baked film | ◯ |
| Example 7 | 250° C. Baked film | ◯ |
| Example 8 | 250° C. Baked film | ◯ |
| Example 9 | 250° C. Baked film | ◯ |

TABLE 3-continued

Evaluation of filling properties

| | | Filling properties |
|---|---|---|
| Example 10 | 250° C. Baked film | ○ |
| Example 11 | 250° C. Baked film | ○ |
| Example 12 | 250° C. Baked film | ○ |
| Example 13 | 250° C. Baked film | ○ |
| Example 14 | 250° C. Baked film | ○ |
| Example 15 | 250° C. Baked film | ○ |
| Example 16 | 250° C. Baked film | ○ |
| Example 17 | 250° C. Baked film | ○ |
| Example 18 | 250° C. Baked film | ○ |
| Example 19 | 250° C. Baked film | ○ |
| Example 20 | 250° C. Baked film | ○ |
| Example 21 | 250° C. Baked film | ○ |
| Example 22 | 250° C. Baked film | ○ |
| Example 23 | 250° C. Baked film | ○ |
| Example 24 | 250° C. Baked film | ○ |
| Example 25 | 250° C. Baked film | ○ |
| Example 26 | 250° C. Baked film | ○ |
| Example 27 | 250° C. Baked film | ○ |
| Example 28 | 250° C. Baked film | ○ |
| Example 29 | 250° C. Baked film | ○ |
| Example 30 | 250° C. Baked film | ○ |
| Example 31 | 250° C. Baked film | ○ |
| Example 32 | 250° C. Baked film | ○ |
| Example 33 | 250° C. Baked film | ○ |
| Example 34 | 250° C. Baked film | ○ |
| Example 35 | 250° C. Baked film | ○ |
| Example 36 | 250° C. Baked film | ○ |
| Example 37 | 250° C. Baked film | ○ |
| Example 38 | 250° C. Baked film | ○ |
| Comparative Example 1 | 250° C. Baked film | X |
| Comparative Example 2 | 250° C. Baked film | X |

[Test of Covering Performance on Stepped Substrates]

To test the covering performance on a stepped substrate, each of the resist underlayer film-forming compositions prepared in Comparative Examples 1 to 7 and Examples 1 to 38 was applied to a 200 nm thick $SiO_2$ substrate, and the coating was baked at 250° C. for 60 seconds to form a resist underlayer film having a thickness of about 200 nm. The coating film thickness was compared between at an 800 nm trenched area (TRENCH) and at a pattern-free open area (OPEN) of the substrate. The flatness of the substrates was evaluated using a scanning electron microscope (S-4800) manufactured by Hitachi High-Tech Corporation by determining the difference in film thickness between on the trenched area (the patterned area) and on the open area (the pattern-free area) of the stepped substrate (the step height created on the coating film between the trenched area and the open area, called the bias). Here, the flatness means how small the difference is in the thickness (the iso-dense bias) of the coating film between on the region with the pattern (the trenched area (the patterned area)) and on the region without patterns (the open area (the pattern-free area)) (Table 4). Specifically, the iso-dense bias is (b-a) in FIG. 1. In the drawing, a is the depth of the recess in the coating film at the center of the dense space, b is the depth of the recess in the coating film at the center of the open area, c is the initial depth of the space in the stepped substrate used, d is the coating film, and is the stepped substrate.

TABLE 4

Evaluation of flatness

| | | Flatness |
|---|---|---|
| Example 1 | 250° C. Baked film | 127 |
| Example 2 | 250° C. Baked film | 57 |
| Example 3 | 250° C. Baked film | 15 |
| Example 4 | 250° C. Baked film | 24 |
| Example 5 | 250° C. Baked film | 28 |
| Example 6 | 250° C. Baked film | 18 |
| Example 7 | 250° C. Baked film | 44 |
| Example 8 | 250° C. Baked film | 32 |
| Example 9 | 250° C. Baked film | 18 |
| Example 10 | 250° C. Baked film | 36 |
| Example 11 | 250° C. Baked film | 32 |
| Example 12 | 250° C. Baked film | 18 |
| Example 13 | 250° C. Baked film | 23 |
| Example 14 | 250° C. Baked film | 34 |
| Example 15 | 250° C. Baked film | 28 |
| Example 16 | 250° C. Baked film | 28 |
| Example 17 | 250° C. Baked film | 42 |
| Example 18 | 250° C. Baked film | 19 |
| Example 19 | 250° C. Baked film | 54 |
| Example 20 | 250° C. Baked film | 50 |
| Example 21 | 250° C. Baked film | 22 |
| Example 22 | 250° C. Baked film | 24 |
| Example 23 | 250° C. Baked film | 38 |
| Example 24 | 250° C. Baked film | 24 |
| Example 25 | 250° C. Baked film | 44 |
| Example 26 | 250° C. Baked film | 34 |
| Example 27 | 250° C. Baked film | 47 |
| Example 28 | 250° C. Baked film | 47 |
| Example 29 | 250° C. Baked film | 22 |
| Example 30 | 250° C. Baked film | 22 |
| Example 31 | 250° C. Baked film | 38 |
| Example 32 | 250° C. Baked film | 38 |
| Example 33 | 250° C. Baked film | 129 |
| Example 34 | 250° C. Baked film | 56 |
| Example 35 | 250° C. Baked film | 31 |
| Example 36 | 250° C. Baked film | 56 |
| Example 37 | 250° C. Baked film | 48 |
| Example 38 | 250° C. Baked film | 63 |
| Comparative Example 1 | 250° C. Baked film | 150 |
| Comparative Example 2 | 250° C. Baked film | 155 |
| Comparative Example 3 | 250° C. Baked film | 32 |
| Comparative Example 4 | 250° C. Baked film | 38 |
| Comparative Example 5 | 250° C. Baked film | 64 |
| Comparative Example 6 | 250° C. Baked film | 64 |
| Comparative Example 7 | 250° C. Baked film | 137 |

INDUSTRIAL APPLICABILITY

The resist underlayer film-forming compositions provided according to the present invention have high etching resistance and good optical constants, offer a good dry etching rate ratio, and exhibit high covering performance even on a so-called stepped substrate to be able to form a flat film that, when applied to fill the unevenness, has a small variation in film thickness. The methods of the present invention can produce polymers suitably used in the resist underlayer film-forming compositions. The resist underlayer films and the semiconductor device manufacturing methods provided according to the present invention can benefit from the use of the resist underlayer film-forming compositions.

The invention claimed is:

1. A resist underlayer film-forming composition comprising a solvent and a reaction product of a C6-C60 aromatic heterocyclic compound and a carbon-oxygen double bond contained in a C3-C60 oxygen-containing compound, the oxygen-containing compound having one partial structure —COO— in the molecule,
wherein the oxygen-containing compound is represented by the following formula (2):

$$R^{21}\text{—COO—}R^{22} \quad \text{Formula (2)}$$

wherein
R$^{21}$ is
a C1-C20 alkyl group which alkyl group is optionally interrupted with an oxygen atom or a sulfur atom, and
R$^{22}$ is hydrogen, a C6-C20 aryl group, or a C1-C20 alkyl group which alkyl group is optionally interrupted with an oxygen atom or a sulfur atom;
the reaction product being such that a same single carbon atom in the oxygen-containing compound connects two molecules of the aromatic heterocyclic compound.

2. A resist underlayer film-forming composition comprising a solvent and a reaction product of a C6-C60 aromatic heterocyclic compound and a carbon-oxygen double bond contained in a C3-C60 oxygen-containing compound,
the oxygen-containing compound having one partial structure —CON< in the molecule,
wherein the oxygen-containing compound is represented by the following formula (1):

[Chemical Formula 55]

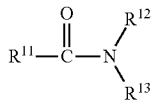

Formula (1)

wherein
R$^{11}$ and R$^{12}$ are each a C6-C20 aryl group, or a C1-C20 alkyl group which alkyl group is optionally interrupted with an oxygen atom or a sulfur atom, optionally condensed with a C6-C20 aryl group, and optionally substituted with an oxo group or a C6-C20 cycloalkyl group, R$^{11}$ and R$^{12}$ may be bonded to each other to form a ring, and
R$^{13}$ is hydrogen, a C6-C20 aryl group, or a C1-C20 alkyl group which alkyl group is optionally interrupted with an oxygen atom or a sulfur atom;
the reaction product being such that a same single carbon atom in the oxygen-containing compound connects two molecules of the aromatic heterocyclic compound.

3. The resist underlayer film-forming composition according to claim 1, wherein the aromatic heterocyclic compound contains one or more benzene rings, naphthalene rings, anthracene rings or pyrene rings, or a combination thereof.

4. The resist underlayer film-forming composition according to claim 1, wherein the aromatic heterocyclic compound contains two or more benzene rings, naphthalene rings, anthracene rings or pyrene rings, or a combination thereof.

5. The resist underlayer film-forming composition according to claim 1, further comprising a crosslinking agent.

6. The resist underlayer film-forming composition according to claim 1, further comprising an acid and/or an acid generator.

7. The resist underlayer film-forming composition according to claim 1, wherein the solvent has a boiling point of not less than 160° C.

8. A resist underlayer film, which is a baked product of a coating film comprising the resist underlayer film-forming composition according to claim 1.

9. A method for manufacturing a semiconductor device, comprising the steps of:
forming a resist underlayer film on a semiconductor substrate using the resist underlayer film-forming composition according to claim 1,
forming a resist film thereon,
forming a resist pattern by light or electron beam irradiation and development,
etching the underlayer film through the resist pattern, and
processing the semiconductor substrate through the underlayer film patterned.

10. A resist underlayer film-forming composition comprising a solvent and a reaction product of a C6-C60 aromatic compound and a carbon-oxygen double bond contained in a C3-C60 oxygen-containing compound that is selected from the group consisting of
(a) C3-C60 oxygen-containing compounds represented by the following formula (1):

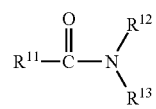

Formula (1)

wherein
R$^{11}$ and R$^{12}$ are each a C6-C20 aryl group, or a C1-C20 alkyl group which alkyl group is optionally interrupted with an oxygen atom or a sulfur atom, optionally condensed with a C6-C20 aryl group, and optionally substituted with an oxo group or a C6-C20 cycloalkyl group, R$^{11}$ and R$^{12}$ may be bonded to each other to form a ring, and
R$^{13}$ is a C6-C20 aryl group, or a C1-C20 alkyl group which alkyl group is optionally interrupted with an oxygen atom or a sulfur atom,
(b) isatin,
(c) 4,4-pentamethylene-2-pyrrolidone, and
(d) laurylamide,
the C6-C60 aromatic compound being:
  (a) a monocyclic compound,
  (b) a condensed ring compound,
  (c) a heterocyclic compound,
  (d) a compound composed of any of the compounds (a) to (c) linked together via a single bond between their aromatic rings, except for biphenyl, or
  (e) a compound composed of any of the compounds (a) to (d) linked together via a spacer selected from the group consisting of —CH—, —(CH$_2$)$_n$-(where n=1 to 20), —CH=CH—, —C≡C—, —N=N—, —NH—, —NHR—, —NHCO—, —NRCO—, —S—, —COO—, —O—, —CO— and —CH=N—, between their aromatic rings, and
the reaction product being such that a same single carbon atom in the oxygen-containing compound connects two molecules of the aromatic compound.

11. The resist underlayer film-forming composition according to claim 10, wherein the aromatic compound contains one or more benzene rings, naphthalene rings, anthracene rings or pyrene rings, or a combination thereof.

12. The resist underlayer film-forming composition according to claim 10, wherein the aromatic compound contains two or more benzene rings, naphthalene rings, anthracene rings or pyrene rings, or a combination thereof.

13. The resist underlayer film-forming composition according to claim 10, further comprising a crosslinking agent.

14. The resist underlayer film-forming composition according to claim 10, further comprising an acid and/or an acid generator.

15. The resist underlayer film-forming composition according to claim 10, wherein the solvent has a boiling point of not less than 160° C.

16. A resist underlayer film, which is a baked product of a coating film comprising the resist underlayer film-forming composition according to claim 10.

17. A resist underlayer film-forming composition comprising a solvent and a reaction product of a C6-C60 aromatic compound and a carbon-oxygen double bond contained in a C3-C60 oxygen-containing compound represented by the following formula (2):

$$R^{21}-COO-R^{22} \quad \text{Formula (2)}$$

wherein
- $R^{21}$ is a C6-C20 aryl group, or a C1-C20 alkyl group which alkyl group is optionally interrupted with an oxygen atom or a sulfur atom, and
- $R^{22}$ is a C6-C20 aryl group, or a C1-C20 alkyl group which alkyl group is optionally interrupted with an oxygen atom or a sulfur atom, the reaction product being such that a same single carbon atom in the oxygen-containing compound connects two molecules of the aromatic compound.

18. The resist underlayer film-forming composition according to claim 17, wherein the aromatic compound contains one or more benzene rings, naphthalene rings, anthracene rings or pyrene rings, or a combination thereof.

19. The resist underlayer film-forming composition according to claim 17, wherein the aromatic compound contains two or more benzene rings, naphthalene rings, anthracene rings or pyrene rings, or a combination thereof.

20. The resist underlayer film-forming composition according to claim 17, further comprising a crosslinking agent.

21. The resist underlayer film-forming composition according to claim 17, further comprising an acid and/or an acid generator.

22. The resist underlayer film-forming composition according to claim 19, wherein the solvent has a boiling point of not less than 160° C.

23. A resist underlayer film, which is a baked product of a coating film comprising the resist underlayer film-forming composition according to claim 17.

24. A resist underlayer film-forming composition comprising a solvent and a polymer selected from the group consisting of
- a polymer that is a reaction product of benzoic acid and carbazole, and
- a polymer that is a reaction product of 1-naphthoic acid and carbazole.

* * * * *